(12) United States Patent
Saito et al.

(10) Patent No.: US 8,422,263 B2
(45) Date of Patent: Apr. 16, 2013

(54) LOAD REDUCED MEMORY MODULE AND MEMORY SYSTEM INCLUDING THE SAME

(75) Inventors: Shunichi Saito, Tokyo (JP); Toshio Sugano, Tokyo (JP); Atsushi Hiraishi, Tokyo (JP); Fumiyuki Osanai, Tokyo (JP); Masayuki Nakamura, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 282 days.

(21) Appl. No.: 12/801,326

(22) Filed: Jun. 3, 2010

(65) Prior Publication Data

US 2010/0309706 A1    Dec. 9, 2010

(30) Foreign Application Priority Data

Jun. 5, 2009   (JP) ................ 2009-136649

(51) Int. Cl.
*G11C 5/06*    (2006.01)
(52) U.S. Cl.
USPC ..... 365/63; 365/51; 365/230.03; 365/233.13; 365/189.05; 365/189.03
(58) Field of Classification Search .......... 365/63, 365/51, 230.03, 233.13, 189.05, 189.03
See application file for complete search history.

(56) References Cited

U.S. PATENT DOCUMENTS

| | | | |
|---|---|---|---|
| 6,594,170 B2 * | 7/2003 | Kudou et al. .................. 365/51 |
| 6,628,538 B2 * | 9/2003 | Funaba et al. ................. 365/63 |
| 6,937,494 B2 * | 8/2005 | Funaba et al. ................. 365/63 |
| 6,961,281 B2 * | 11/2005 | Wong et al. ............. 365/230.03 |
| 7,072,201 B2 * | 7/2006 | So et al. ........................ 365/63 |
| 7,299,313 B2 * | 11/2007 | Gower et al. ................. 711/100 |
| 7,379,316 B2 * | 5/2008 | Rajan ............................. 365/63 |
| 7,440,289 B2 | 10/2008 | Sugano et al. |
| 7,471,538 B2 * | 12/2008 | Hofstra .......................... 365/51 |
| 7,477,522 B2 * | 1/2009 | Hazelzet ...................... 361/760 |
| 7,516,281 B2 * | 4/2009 | LaBerge ...................... 711/154 |
| 7,542,322 B2 * | 6/2009 | McCall et al. ................. 365/52 |
| 7,562,271 B2 * | 7/2009 | Shaeffer et al. .............. 714/724 |
| 7,636,274 B2 * | 12/2009 | Solomon et al. ......... 365/233.13 |
| 7,646,650 B2 * | 1/2010 | Braun et al. ............. 365/189.05 |
| 7,839,712 B2 * | 11/2010 | Djordjevic .............. 365/230.01 |
| 7,859,879 B2 * | 12/2010 | Park et al. ...................... 365/51 |
| 8,001,434 B1 * | 8/2011 | Lee et al. ...................... 714/733 |
| 8,028,144 B2 * | 9/2011 | Hampel et al. ............... 711/168 |
| 8,040,710 B2 * | 10/2011 | Bacha ............................ 365/63 |
| 8,051,253 B2 * | 11/2011 | Okin et al. .................... 711/154 |
| 8,069,379 B2 * | 11/2011 | Perego et al. ................ 714/718 |
| 8,090,897 B2 * | 1/2012 | Rajan et al. .................. 711/103 |
| 8,094,504 B2 * | 1/2012 | Smolka ................... 365/189.05 |
| 8,130,560 B1 * | 3/2012 | Rajan et al. ............. 365/189.03 |

(Continued)

FOREIGN PATENT DOCUMENTS

JP    2008-135597 A    6/2008

*Primary Examiner* — Viet Q Nguyen
(74) *Attorney, Agent, or Firm* — McGinn IP Law Group, PLLC

(57) ABSTRACT

A memory module includes a plurality of memory chips, a plurality of data register buffers, and a command/address/control register buffer mounted on a module PCB. The data register buffers perform data transfers with the memory chips. The command/address/control register buffer performs buffering of a command/address/control signal and generates a control signal. The buffered command/address/control signal is supplied to the memory chips, and the control signal is supplied to the data register buffers. According to the present invention, because line lengths between the data register buffers and the memory chips are shortened, it is possible to realize a considerably high data transfer rate.

21 Claims, 29 Drawing Sheets

U.S. PATENT DOCUMENTS 8,143,720 B2 * 3/2012 Lambrecht .................... 257/723
8,199,521 B2 * 6/2012 Muff ............................. 361/777

2008/0123303 A1 5/2008 Sugano et al.

* cited by examiner

LOAD REDUCED MEMORY MODULE AND MEMORY SYSTEM INCLUDING THE SAME

BACKGROUND OF THE INVENTION

1. Field of the Invention

The present invention relates to a memory module and a memory system including the same, and more particularly relates to a Load Reduced memory module and a memory system including the same.

2. Description of Related Art

A memory module such as a DIMM (Dual Inline Memory Module) has a configuration in which a large number of memory chips such as DRAMs (Dynamic Random Access Memories) are mounted on a module printed circuit board (PCB). Such a memory module is inserted in a memory slot provided on a motherboard, thereby a data transfer is performed between a memory controller and the memory module. In recent years, because a system requires a considerable amount of memory capacity, it is hard to provide the required memory capacity with a single memory module. Therefore, in most cases, the motherboard includes a plurality of memory slots, so that a plurality of memory modules can be mounted on the motherboard.

However, when a plurality of memory modules are mounted on a motherboard, a load capacity of a data line on the motherboard increases, resulting in a degradation of signal quality. Although it does not cause a serious problem when a data transfer rate between the memory controller and the memory module is relatively low, it may cause a serious problem that the data transfer cannot be performed in a proper manner due to the degradation of the signal quality when the data transfer rate increases to a certain level. In recent years, a data transfer rate as high as about 1.6 Gbps to 3.2 Gbps is required, and in order to realize such a high speed data transfer, it is necessary to reduce the load capacity of the data line on the motherboard to a sufficiently low level.

A so-called Fully Buffered memory module is known as a memory module in which the load capacity of the data line can be reduced (Japanese Patent Application Laid-open No. 2008-135597). In a write operation of the Fully Buffered memory module, a dedicated chip called an Advanced Memory Buffer (AMB) once receives all write data supplied from the memory controller, and then the AMB supplies the write data to a predetermined memory chip. A read operation is opposite to the write operation, in which all read data output from a memory chip is once supplied to the AMB, and then the read data is supplied from the AMB to the memory controller. As a result, because the memory controller does not experience the load capacity of each memory chip, the load capacity of the data line is considerably reduced.

However, because the AMB employed in the Fully Buffered memory module is a sophisticated chip, which is relatively expensive, it causes a problem that the cost of the memory module considerably increases. Further, because an interface between the memory controller and the AMB is different from a typical interface between the memory controller and the memory chip in the Fully Buffered memory module, it causes another problem that a conventional memory controller cannot be used as it is.

Because of such a background, a memory module called a Load Reduced memory module has been recently proposed. The Load Reduced memory module is a memory module in which a register buffer is used instead of the AMB. Because the register buffer is a chip that only buffers signals such as data and command/address, it can be provided at low cost. In addition, because an interface between the memory controller and the register buffer has no difference from the typical interface between the memory controller and the memory chip in the Load Reduced memory module, the conventional memory controller can be used as it is.

However, from a result of extensive researches on the Load Reduced memory module by the present inventors, it has been found that, when the data transfer rate is considerably high, simply using a single register buffer is not sufficient to maintain the signal quality on the module PCB. To deal with this problem, the present inventors performed further researches on a Load Reduced memory module in which a considerably high data transfer rate can be realized. The present invention has been achieved as a result of such researches.

SUMMARY

In one embodiment, there is provided a memory module comprising: a circuit board including a plurality of data connectors and a plurality of command/address/control connectors; a plurality of memory chips mounted on the circuit board; a plurality of data register buffers mounted on the circuit board, each of the data register buffers being assigned to at least two memory chips; and a command/address/control register buffer mounted on the circuit board, wherein each of the data register buffers receives write data transferred via corresponding data connectors, outputs the write data to corresponding memory chips, receives read data transferred from the corresponding memory chips, and outputs the read data to the corresponding data connectors, the command/address/control register buffer includes a register circuit that receives a command/address/control signal supplied via the command/address/control connectors, and a control signal generating circuit that generates a control signal based on the command/address/control signal, the register circuit of the command/address/control register buffer supplies the command/address/control signal to the memory chips, and the control signal generating circuit of the command/address/control register buffer supplies the control signal to the data register buffers.

Further, in another embodiment, there is provided a memory system comprising a memory module and a memory controller, wherein the memory module includes: a circuit board including a plurality of data connectors and a plurality of command/address/control connectors electrically connected to the memory controller; a plurality of memory chips mounted on the circuit board; a plurality of data register buffers mounted on the circuit board, each of the data register buffers being assigned to at least two memory chips; and a command/address/control register buffer mounted on the circuit board, each of the data register buffers receives write data transferred from the memory controller via corresponding data connectors, outputs the write data to corresponding memory chips, and supplies read data transferred from the corresponding memory chips to the memory controller by receiving the read data and outputting the read data to the corresponding data connectors, the command/address/control register buffer includes a register circuit that receives a command/address/control signal supplied from the memory controller via the command/address/control connectors, and a control signal generating circuit that generates a control signal based on the command/address/control signal, the register circuit of the command/address/control register buffer supplies the command/address/control signal to the memory chips, and the control signal generating circuit of the command/address/control register buffer supplies the control signal to the data register buffers.

According to the present invention, because a plurality of data register buffers are mounted on a module PCB and a command/address/control register buffer is mounted on the module PCB separately from the data register buffers, a line length between a data register buffer and a memory chip is considerably shortened, as compared to a case that a single register buffer is used. This makes it possible to enhance the signal quality on the module PCB. As a result, it is possible to realize a considerably high data transfer rate.

BRIEF DESCRIPTION OF THE DRAWINGS

The above features and advantages of the present invention will be more apparent from the following description of certain preferred embodiments taken in conjunction with the accompanying drawings, in which:

FIG. 8A is a layout diagram and FIG. 8B is a connection diagram FIG. 9A is a layout diagram and FIG. 9B is a connection diagram;

FIG. 14A is a timing chart at the time of starting the leveling and FIG. 14B is a timing chart at the time of ending the leveling;

FIG. 16A is a timing chart at the time of starting the leveling and FIG. 16B is a timing chart at the time of ending the leveling;

FIG. 23A is a layout diagram and FIG. 23B is a connection diagram;

FIG. 24A is a layout diagram and FIG. 24B is a connection diagram;

DETAILED DESCRIPTION OF THE EMBODIMENTS

Preferred embodiments of the present invention will be explained below in detail with reference to the accompanying drawings.

Figure 1:
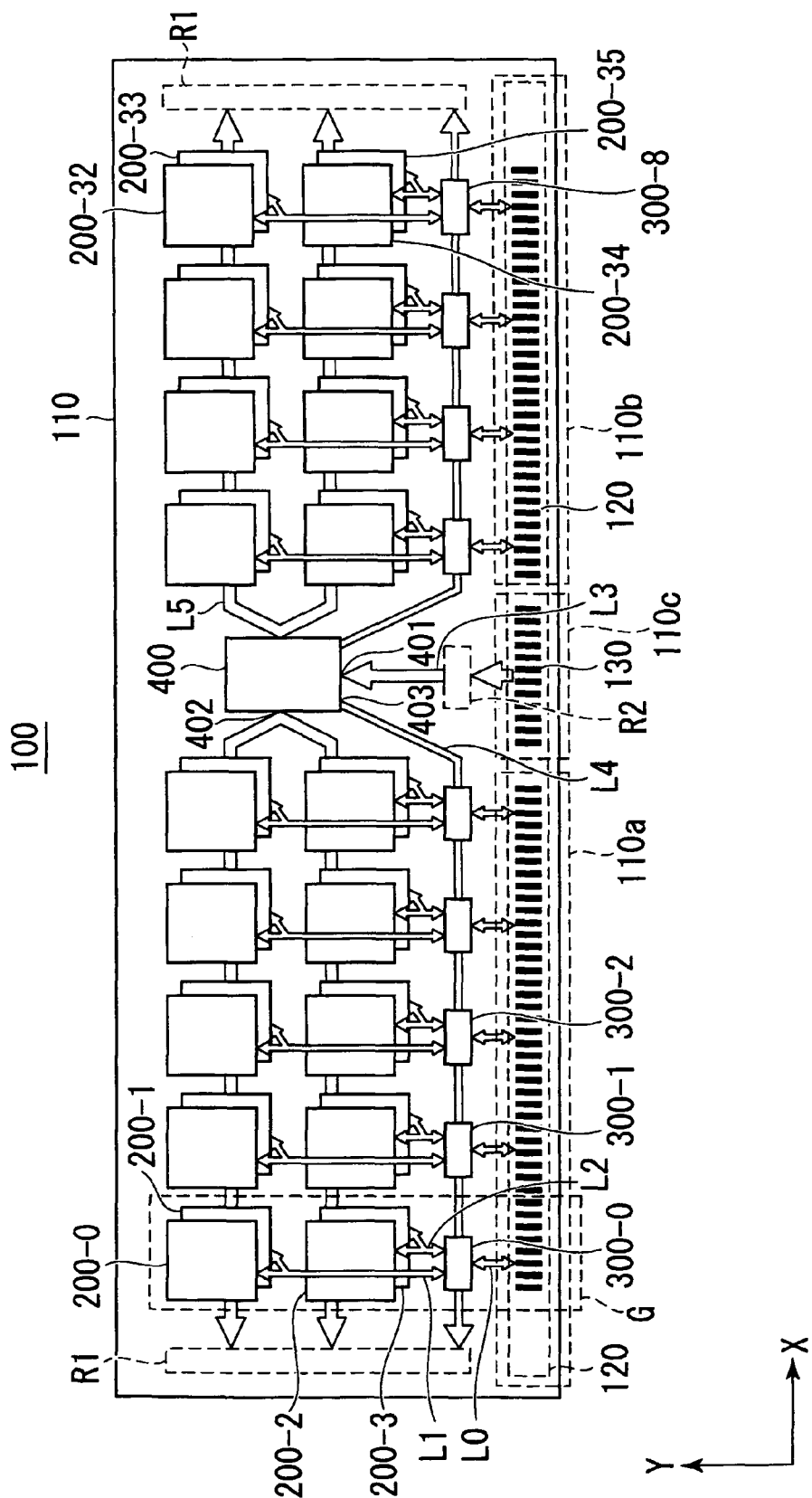
FIG. 1 is a schematic diagram of a configuration of a memory module 100 according to an embodiment of the present invention.

FIG. 1 is a schematic diagram of a configuration of a memory module 100 according to an embodiment of the present invention.

As shown in FIG. 1, the memory module 100 according to the present embodiment includes a module PCB 110, a plurality of memory chips 200 mounted on the module PCB 110, a plurality of data register buffers 300, and a command/address/control register buffer 400.

In the present embodiment, the memory module 100 includes thirty-six memory chips 200. When it is necessary to specify each of the memory chips, the memory chips are respectively represented by memory chips 200-0 to 200-35. Furthermore, in the present embodiment, the memory module 100 includes nine data register buffers 300. When it is necessary to specify each of the data register buffers, the data register buffers are respectively represented by data register buffers 300-0 to 300-8. On the other hand, the command/address/control register buffer 400 is provided as a single unit. However, it is not essential to set the number of units of the command/address/control register buffer 400 to one, but two or more units of the command/address/control register buffer 400 can be mounted without any limitation.

The module PCB 110 is a printed circuit board that includes a multilayer wiring. The planar shape of the module PCB 110 is substantially rectangle, as shown in FIG. 1, with a long side in the X direction and a short side in the Y direction. On one side of the module PCB 110 along the X direction, which is the long side, a plurality of data connectors 120 and a plurality of command/address/control connectors 130 are provided. The data connectors 120 and the command/address/control connectors 130 are terminals for making an electrical connection with a memory controller via a memory slot, which will be described later.

The data connectors 120 are connectors for exchanging write data to be written in the memory chip 200 and read data read from the memory chip 200 between the memory module 100 and the memory controller. Although it is not particularly limited, the number of pins of the data connectors 120 is seventy two in the present embodiment. As shown in FIG. 1, among the seventy-two data connectors 120, data connectors corresponding to the memory chips 200-0 to 200-19 are arranged in an area 110a that is located substantially right below the memory chips 200-0 to 200-19, and data connectors corresponding to the memory chips 200-20 to 200-35 are arranged in an area 110b that is located substantially right below the memory chips 200-20 to 200-35.

The command/address/control connectors 130 are connectors for supplying a command signal, an address signal, a control signal, and a clock signal to be supplied to the command/address/control register buffer 400. As shown in FIG. 1, the command/address/control connectors 130 are arranged in an area 110c that is located between the area 110a and the area 110b.

The memory chips 200 are, for example, DRAMs. The memory chips 200-0, 200-2, . . . with even branch numbers are mounted on one surface of the module PCB 110 (a first surface), and the memory chips 200-1, 200-3, . . . with odd branch numbers are mounted on the other surface of the module PCB 110 (a second surface). Two corresponding memory chips, for example, the memory chips 200-0 and 200-1 are mounted at positions facing each other across the module PCB 110, respectively.

The memory module 100 according to the present embodiment has a so-called 4-Rank configuration. The number of Ranks indicates the number of memory spaces that can be selected in an exclusive manner. Although the same address is assigned to each of the Ranks, one of the Ranks is selected by exclusively activating a chip select (CS) signal or a clock enable (CKE) signal.

In the present embodiment, four memory chips 200 constitute a single group (a single set), and the four memory chips 200 constituting the single group belong to different Ranks from each other. For example, the memory chips 200-0 to 200-3 constitute a single group, and the memory chips 200-0 to 200-3 belong to different Ranks from each other.

As shown in FIG. 1, the four memory chips 200 constituting a single group are connected to one of the data register buffers 300. For example, the group of the memory chips 200-0 to 200-3 is connected to the data register buffer 300-0. Among the memory chips 200-0 to 200-3, the memory chips 200-0 and 200-1 that are mounted on the upper side of the module PCB 110 are connected to the data register buffer 300-0 via a data line L1, and the memory chips 200-2 and 200-3 that are mounted on the lower side of the module PCB 110 are connected to the data register buffer 300-0 via a data line L2. An arrow of each of the data lines L1 and L2 shown in FIG. 1 indicates a line of 1 byte (8 bits). Both the data lines L1 and L2 are formed inside the module PCB 110.

An operation of the memory chip 200 is controlled based on the command signal, the address signal, the control signal, and the clock signal supplied from the command/address/control register buffer 400. Details on the memory chip 200 will be described later.

A single data register buffer 300 is allocated for every four memory chips 200, as described above, so that nine data register buffers 300 are arranged along the X direction, which is the long side. The data register buffer 300 is a chip for buffering write data that is transferred via a data line L0 and outputting the write data to either one of the data lines L1 and L2, and at the same time, buffering read data that is transferred via either one of the data lines L1 and L2 and outputting the read data to the data line L0. The data line L0 is also formed inside the module PCB 110.

With the above configuration, the single data register buffer 300, the data connectors 120 and the four memory chips 200 corresponding to the data register buffer 300 constitute a group G. The memory chips 200, the data register buffer 300, and the data connectors 120 included in the same group are arranged along the Y direction, which is the short side, and a plurality of groups G formed in the above manner are arranged along the X direction, which is the long side. Therefore, a relative positional relationship between each of the data register buffers 300 and corresponding four memory chips 200 becomes constant in all the groups G.

With this arrangement, a line length of the data line L0 can be shortened, and at the same time, the line length of the data line L0 can be made substantially equal among the groups. Similarly, line lengths of the data lines L1 and L2 can be shortened, and at the same time, the line lengths of the data lines L1 and L2 can be made substantially equal among the groups.

An operation of the data register buffer 300 is controlled based on the control signal supplied from the command/address/control register buffer 400. Details on the data register buffer 300 will be described later.

Only a single command/address/control register buffer 400 is mounted on the module PCB 110. As shown in FIG. 1, the command/address/control register buffer 400 is arranged at an approximate center portion of the module PCB 110 in the X direction, which is the long side.

The command/address/control register buffer 400 receives the command signal, the address signal, the control signal, and the clock signal (in some cases, collectively referred to as a command/address/control signal and the like) that are supplied from the command/address/control connectors 130 through an input terminal 401, buffers the signals, and supplies the signals to the memory chips 200. At the same time, the command/address/control register buffer 400 generates a control signal. The command/address/control signal to be supplied to the memory chips 200 are output through an output terminal 402, and the control signal to be supplied to the data register buffers 300 are output through an output terminal 403.

The output terminal 402 is provided at each of the left side and the right side of the command/address/control register buffer 400. For example, the output terminal 402 at the left side is commonly connected to the memory chips 200-0 to 200-19 except for a control signal that is used to select the Rank. That is, the command signal, the address signal, and the clock signal are commonly supplied to the memory chips 200-0 to 200-19. Similarly, the output terminal 403 is provided at each of the left side and the right side of the command/address/control register buffer 400. For example, the output terminal 403 at the left side is commonly connected to the data register buffers 300-0 to 300-4, so that the generated control signal is commonly supplied to the data register buffers 300-0 to 300-4.

In addition, on the module PCB 110, a terminating resistor R1 is provided at both edges in the X direction to prevent a reflection of the command/address signal and the control signal output from the command/address/control register buffer 400. Furthermore, in order to prevent a reflection wave of the command/address/control signal that is input to the command/address/control register buffer 400, a stub resistor R2 is inserted on a command/address/control line L3 that connects the command/address/control connectors 130 and the command/address/control register buffer 400. Details on the command/address/control register buffer 400 will be described later.

Figure 2:
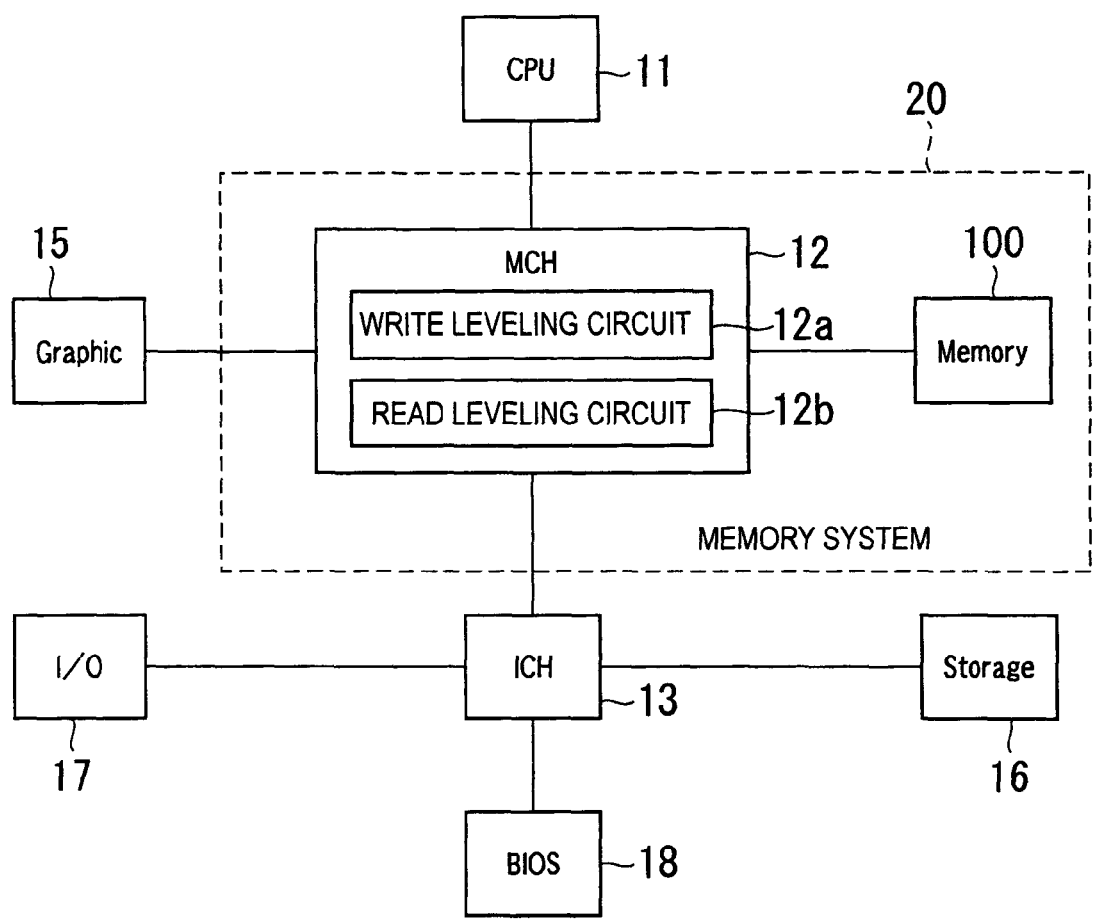
FIG. 2 is a block diagram of a configuration of an information processing system 10 including the memory module 100 according to the present embodiment.

FIG. 2 is a block diagram of a configuration of an information processing system 10 including the memory module 100 according to the present embodiment.

The information processing system 10 shown in FIG. 2 includes a CPU 11, a memory control hub (MCH) 12, and various devices that are connected to the CPU 11 via an interface controller hub (ICH) 13.

The memory module 100 shown in FIG. 1 and a graphic controller 15 are connected to the MCH 12. As shown in FIG. 2, the memory module 100 and the MCH 12 constitute a memory system 20, where the MCH 12 has a controller function for the memory module 100. That is, the MCH 12 functions as a memory controller for the memory module 100.

A storage device 16, an I/O device 17, and a BIOS (Basic Input/Output System) 18 are connected to the ICH 13. The storage device 16 includes a magnetic drive such as a hard disk drive, an optical drive such as a CD-ROM drive, and the like. The I/O device 17 includes an input device such as a keyboard and a mouse, an output device such as a speaker, and a network device such as a modem and a LAN. The BIOS 18 is a kind of firmware that stores therein various pieces of basic information about the information processing system 10, which is formed by a nonvolatile memory such as a flash memory.

Figure 3:
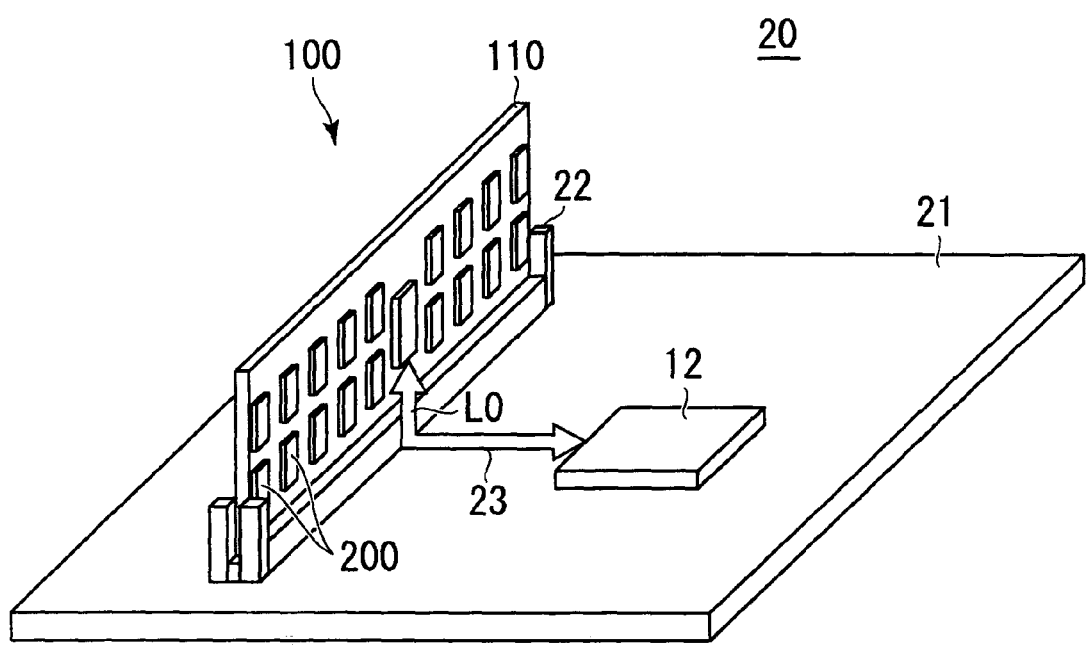
FIG. 3 is a perspective view of a part of a configuration of a motherboard 21 on which the memory system 20 is mounted.

FIG. 3 is a perspective view of a part of a configuration of a motherboard 21 on which the memory system 20 is mounted.

As shown in FIG. 3, a memory slot 22 is provided on the motherboard 21, so that the memory module 100 is inserted in the memory slot 22. On the other hand, a memory controller 12 is directly mounted on the motherboard 21. As described above, a plurality of memory chips 200 are mounted on the memory module 100.

On a signal path between the memory controller 12 and the memory chips 200, there exist a line 23 formed on the motherboard 21 and the data line L0 and the command/address/control line L3 formed on the module PCB 110. However, as described above referring to FIG. 1, in the memory module 100 according to the present embodiment, because the data register buffer 300 is connected to the data line L0, the memory controller 12 cannot experience the load capacity of the memory chips 200 that exist on the signal path beyond the data register buffer 300. Similarly, because the command/address/control register buffer 400 is connected to the command/address/control line L3, the memory controller 12 cannot experience the load capacity of the memory chips 200 that exist on the signal path beyond the command/address/control register buffer 400. Therefore, the load capacity of the signal path that connects the memory controller 12 and the memory module 100 is reduced, making it possible to ensure an excellent signal quality even with a high data transfer rate.

Although only a single memory slot 22 is provided on the motherboard 21 in the memory system 20 shown in FIG. 3, in actual cases, a plurality of memory slots (for example, four) are provided on the memory system, so that the memory module 100 is mounted on each of the memory slots. As the number of units of the memory module 100 increases, the load capacity of the signal path increases by the number of memory modules. However, according to the present embodiment, because the load capacity per memory module is considerably smaller than that of a conventional memory module, it is possible to perform a high speed data transfer even when a plurality of memory modules are mounted.

A configuration of the memory chip 200 is explained next.

Figure 4:
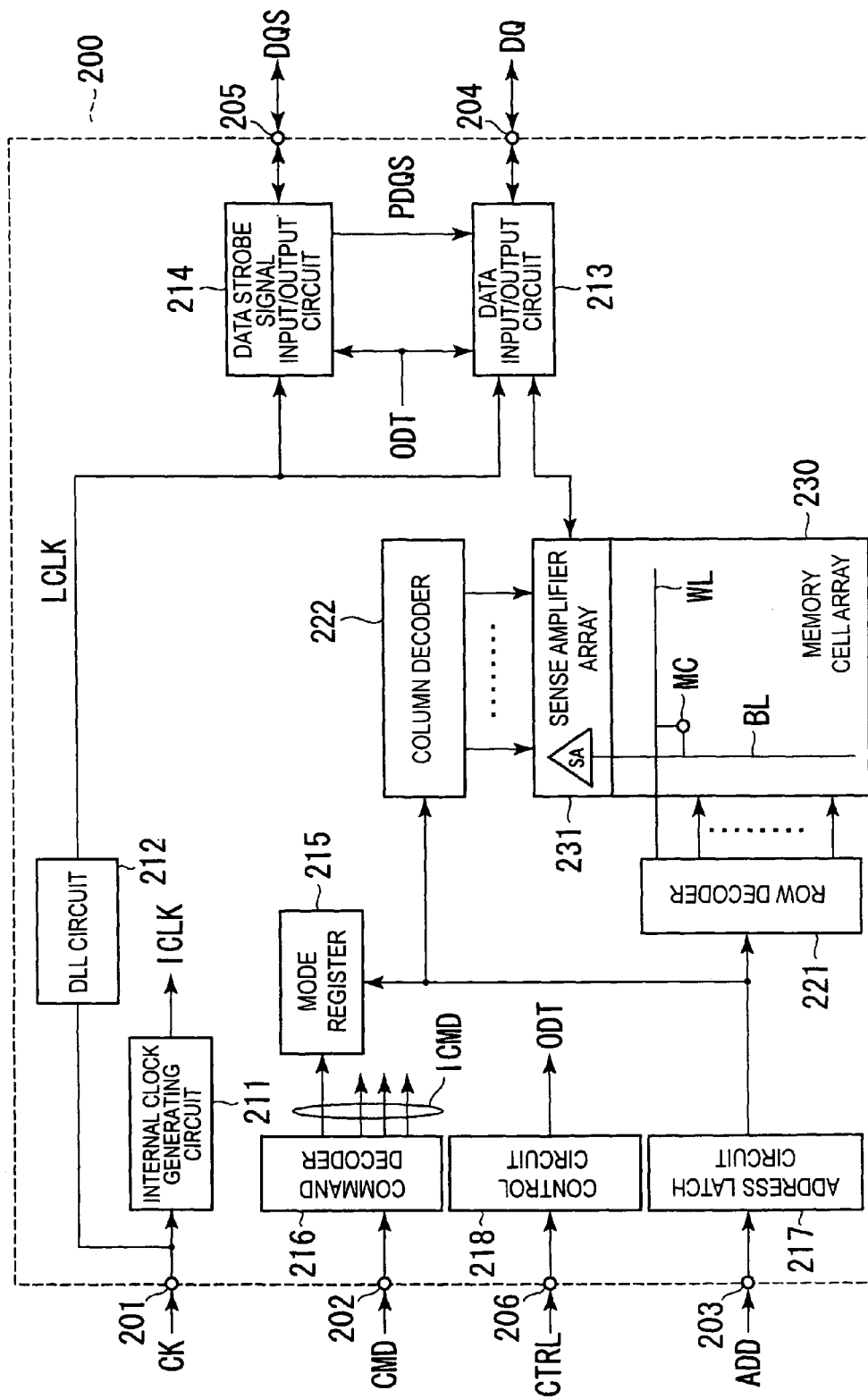
FIG. 4 is a perspective view of apart of a configuration of a motherboard 21 on which the memory system 20 is mounted.

FIG. 4 is a block diagram of a configuration of the memory chip 200.

The memory chip 200 is a DRAM, which includes, as shown in FIG. 4, a clock terminal 201, a command terminal 202, a control terminal 206, an address terminal 203, a data input/output terminal 204, and a data strobe terminal 205 as external terminals. Among these terminals, the clock terminal 201, the command terminal 202, the control terminal 206, and the address terminal 203 are connected to the command/address/control register buffer 400 via a command/address/control line L5 shown in FIG. 1. The data input/output terminal 204 and the data strobe terminal 205 are connected to the data register buffer 300 via the data line L1 or the data line L2 shown in FIG. 1. Although not shown in FIG. 1, the memory chip 200 further includes other terminals such as a power supply terminal.

The clock terminal 201 is a terminal to which a clock signal CK is supplied. The clock signal CK is then supplied to an internal clock generating circuit 211. An internal clock ICLK, which is an output of the internal clock generating circuit 211, is supplied to various internal circuits. The clock signal CK is also supplied to a DLL circuit 212. The DLL circuit 212 takes a role of generating an internal clock LCLK and supplying the internal clock LCLK to a data input/output circuit 213 and a data strobe signal input/output circuit 214. The internal clock LCLK is a signal that is phase-controlled with respect to the clock signal CK, of which a phase is slightly advanced with respect to the clock signal CK such that phases of read data DQ and a data strobe signal DQS match with a phase of the clock signal CK.

It is selected based on a set content in a mode register whether to use the DLL circuit 212. That is, when "DLL on mode" is set in a mode register 215, the DLL circuit 212 is enabled, so that the internal clock LCLK is phase-controlled with respect to the clock signal CK. On the other hand, when "DLL off mode" is set in the mode register 215, the DLL circuit 212 is disabled (the clock signal CK is shortcut), so that the internal clock LCLK is not phase-controlled with respect to the clock signal CK.

The command terminal 202 is a terminal to which a command signal CMD that includes a row address strobe (RAS) signal, a column address strobe (CAS) signal, a write enable (WE) signal, and the like is supplied. The control terminal 206 is a terminal to which a control signal CTRL for each Rank, such as a chip select (CS) signal, a clock enable (CKE) signal, and an on die termination (ODT) signal, is supplied. By the chip select (CS) signal, a DRAM for which a command is to be issued is switched, and an activation of a clock system and a control of an on die termination in the DRAM are performed. The command signal CMD is supplied to a command decoder 216. The command decoder 216 is a circuit that generates various internal commands ICMD by storing, decoding, and counting the command signal in synchronization with the internal clock ICLK. The generated internal commands are supplied to various control circuits (not shown) including the mode register 215. The control signal CTRL is supplied to a control circuit 218. The control circuit 218 is a circuit that generates an internal control signal such as the ODT signal based on the control signal CTRL.

The address terminal 203 is a terminal to which an address signal ADD is supplied. The address signal is then supplied to an address latch circuit 217. The address latch circuit 217 is a circuit that latches the address signal ADD in synchronization with the internal clock ICLK. Among the address signals ADD that are latched in the address latch circuit 217, a row address is supplied to a row decoder 221 and a column address is supplied to a column decoder 222. In addition, upon entering a mode register set, the address signal ADD is supplied to the mode register 215, by which a content of the mode register 215 is updated.

The row decoder 221 is a circuit that selects one of word lines WL included in a memory cell array 230. In the memory cell array 230, a plurality of word lines WL and a plurality of bit lines BL intersect with each other, and a memory cell MC is arranged at each intersection point (only a single word line WL, a single bit line BL, and a single memory cell MC are shown in FIG. 4). The bit line BL is connected to one of sense amplifiers SA that are included in a sense amplifier array 231. The column decoder 222 performs a selection of the sense amplifier SA.

The selected sense amplifier SA is connected to the data input/output circuit 213. The internal clock LCLK and an internal data strobe signal PDQS are supplied to the data input/output circuit 213. In a read operation, the data input/output circuit 213 outputs read data in synchronization with the internal clock LCLK, and in a write operation, the data input/output circuit 213 loads write data in synchronization with the internal data strobe signal PDQS. With this arrangement, in the read operation, the read data read out from the memory cell array 230 is output from the data input/output terminal 204, and in the write operation, the write data received from the data input/output terminal 204 is supplied to the memory cell array 230.

The data strobe terminal 205 is a terminal for performing input and output of the data strobe signal DQS, which is connected to the data strobe signal input/output circuit 214. The data strobe signal input/output circuit 214 generates the internal data strobe signal PDQS described above, and supplies it to the data input/output circuit 213.

The ODT signal, which is an output of the control circuit 218, is also supplied to the data input/output circuit 213 and the data strobe signal input/output circuit 214. When the ODT signal is activated, both the data input/output circuit 213 and the data strobe signal input/output circuit 214 function as terminating resistors.

The overall configuration of the memory chip 200 is as described above. A configuration of the data register buffer 300 is explained next.

Figure 5:
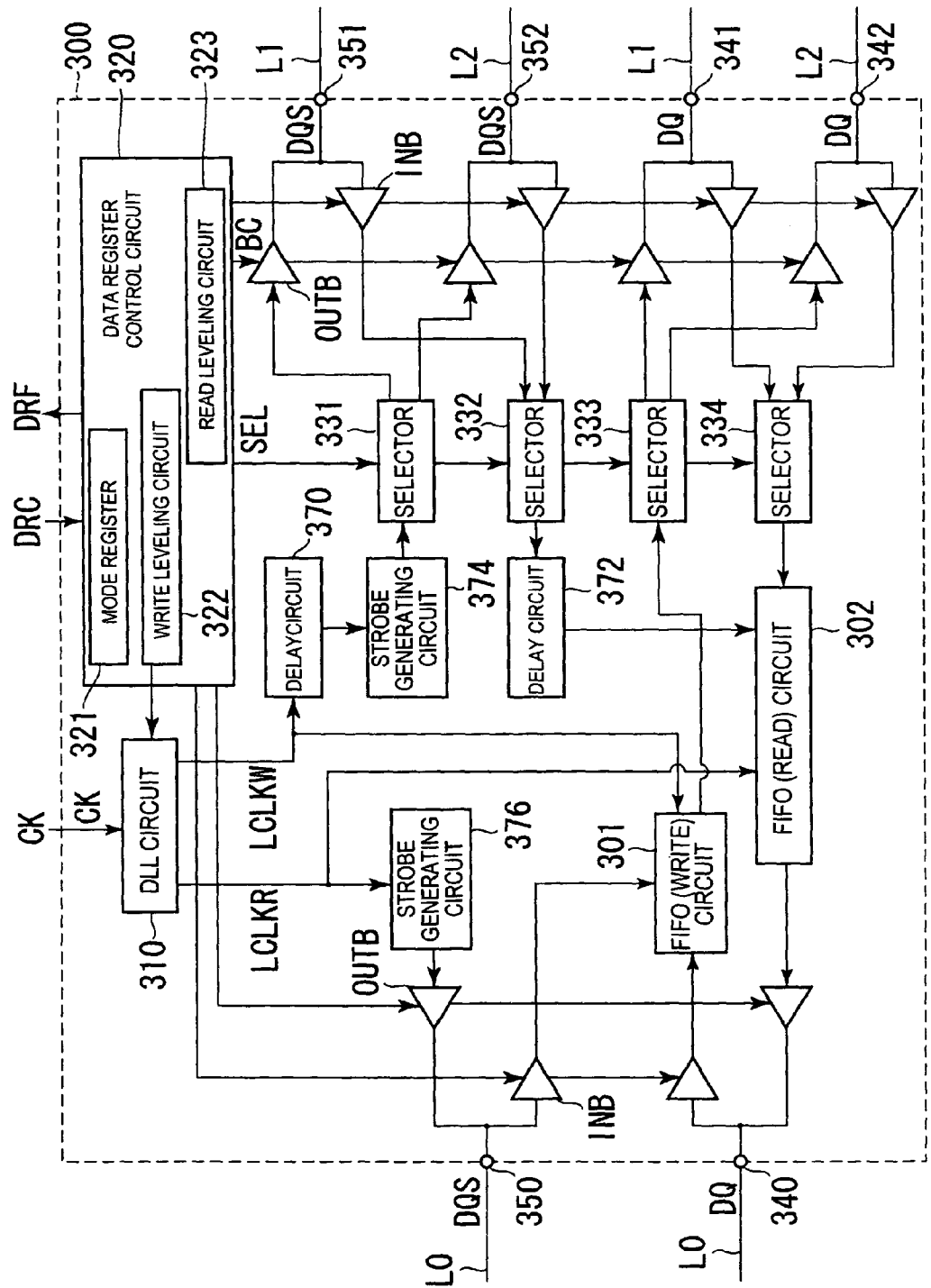
FIG. 5 is a block diagram of the configuration of the data register buffer 300.

FIG. 5 is a block diagram of the configuration of the data register buffer 300.

As shown in FIG. 5, the data register buffer 300 includes a FIFO (Write) circuit 301 and a FIFO (Read) circuit 302. The FIFO (Write) circuit 301 buffers data DQ that is supplied via an input/output terminal 340 with a data strobe signal DQS that is supplied via an input/output terminal 350. The FIFO (Read) circuit 302 buffers data DQ that is supplied via an input/output terminal 341 or 342 with a data strobe signal DQS that is supplied via an input/output terminal 351 or 352. A strobe generating circuit 376 generates a data strobe signal DQS to be supplied to the data connectors 120, in synchronization with an internal clock LCLKR that is generated by a DLL circuit 310. A strobe generating circuit 374 generates a data strobe signal DQS to be supplied to the memory chip 200, in synchronization with an internal clock LCLKW that is generated by the DLL circuit 310.

The FIFO circuits 301 and 302 shown in FIG. 5 are circuits that perform input and output of 1-bit data, so that in an actual case, the number of sets of the FIFO circuits 301 and 302 as many as a width of input/output data are provided. In the present embodiment, because a single data register buffer 300 inputs and outputs 1-byte data, 8 sets of the FIFO circuits 301 and 302 are required.

The input/output terminals 340 and 350 are connected to the data connectors 120 via the data line L0. On the other hand, the input/output terminals 341 and 351 are connected to the memory chip 200 via the data line L1, and the input/output terminals 342 and 352 are connected to the memory chip 200 via the data line L2. In this manner, for the data register buffer 300, the number of the input/output terminals (M) to be connected to the memory controller 12 and the number of the input/output terminals (N) to be connected to the memory chip 200 are different from each other, which is, in the present embodiment, N=2M. In other words, the number of the data lines L1 and L2 is N/M times the number of the data line L0 (two times in the present embodiment).

An output operation timing of the FIFO (Write) circuit 301 is defined by the internal clock LCLKW that is generated by the DLL circuit 310. An output operation timing of the FIFO (Read) circuit 302 is defined by the internal clock LCLKR that is generated by the DLL circuit 310. The DLL circuit 310 is a circuit that generates the internal clocks LCLKW and LCLKR based on the clock signal CK that is supplied from the command/address/control register buffer 400, having the same circuit configuration and function as that of the DLL circuit 212 provided in the memory chip 200. It is selected based on a set content in a data register control circuit 320 whether to use the DLL circuit 310. The DLL circuit 310 can be replaced with a PLL circuit.

The data register control circuit 320 is a circuit that controls the operation of the data register buffer 300 based on a control signal DRC that is supplied from the command/address/control register buffer 400. Specifically, the data register control circuit 320 controls operations of an input buffer INB and an output buffer OUTB by generating a buffer control signal BC, and at the same time, controls operations of selectors 331 to 334 by generating a select signal SEL. Contents of controlling the output buffer OUTB include, for example, an adjustment of output impedance and an on/off control of an ODT operation. It is selected based on a set content in a mode register 321 that is included in the data register control circuit 320 whether to use the ODT function.

In addition, the data register control circuit 320 generates a feedback signal DRF and supplies it to the command/address/control register buffer 400. The feedback signal DRF is a signal indicating a current status of the data register buffer 300.

Furthermore, the data register control circuit 320 includes a write leveling circuit 322 and a read leveling circuit 323. The write leveling circuit 322 is a circuit for performing a write leveling operation, and the read leveling circuit 323 is a circuit for performing a read leveling operation. Details on the write leveling operation and the read leveling operation will be described later.

The selector 333 is a circuit that supplies data DQ that is an output of the FIFO (Write) circuit 301 to either one of the input/output terminals 341 and 342. The selector 334 is a circuit that selects data DQ input from either one of the input/output terminals 341 and 342 and supplies the selected data DQ to the FIFO (Read) circuit 302. The selectors 331 and 332 perform the similar functions as those of the selectors 333 and 334, respectively. Specifically, the selector 332 selects a data strobe signal DQS input from either one of the input/output terminals 351 and 352. A phase of the selected data strobe signal DQS is delayed by about 90 degrees by a delay circuit 372, and then the data strobe signal DQS is supplied to the FIFO (Read) circuit 302 as an input trigger signal. The selector 331 supplies the data strobe signal DQS that is supplied from the strobe generating circuit 374 to either one of the input/output terminals 351 and 352. A phase of the data strobe signal DQS generated by the strobe generating circuit 374 is delayed by about 90 degrees with respect to the internal clock LCLKW by a delay circuit 370. Each of the selections by the selectors 331 to 334 is specified by the select signal SEL that is an output of the data register control circuit 320.

In this manner, the data register buffer 300 buffers the write data that is transferred via the data line L0 and outputs the write data to either one of the data lines L1 and L2, and buffers the read data that is transferred via either one of the data lines L1 and L2 and outputs the read data to the data line L0. Because the data register buffer 300 only performs the buffering of the data, transfer rates of the write data and the read data that are transferred via the data line L0 and transfer rates of the write data and the read data that are transferred via the data lines L1 and L2 are equal to each other.

Therefore, the data register buffer 300 can be implemented with a chip that is provided at relatively low cost instead of an expensive chip such as an AMB used in a Fully Buffered memory module.

The overall configuration of the data register buffer 300 is as described above. A configuration of the command/address/control register buffer 400 is explained next.

Figure 6:
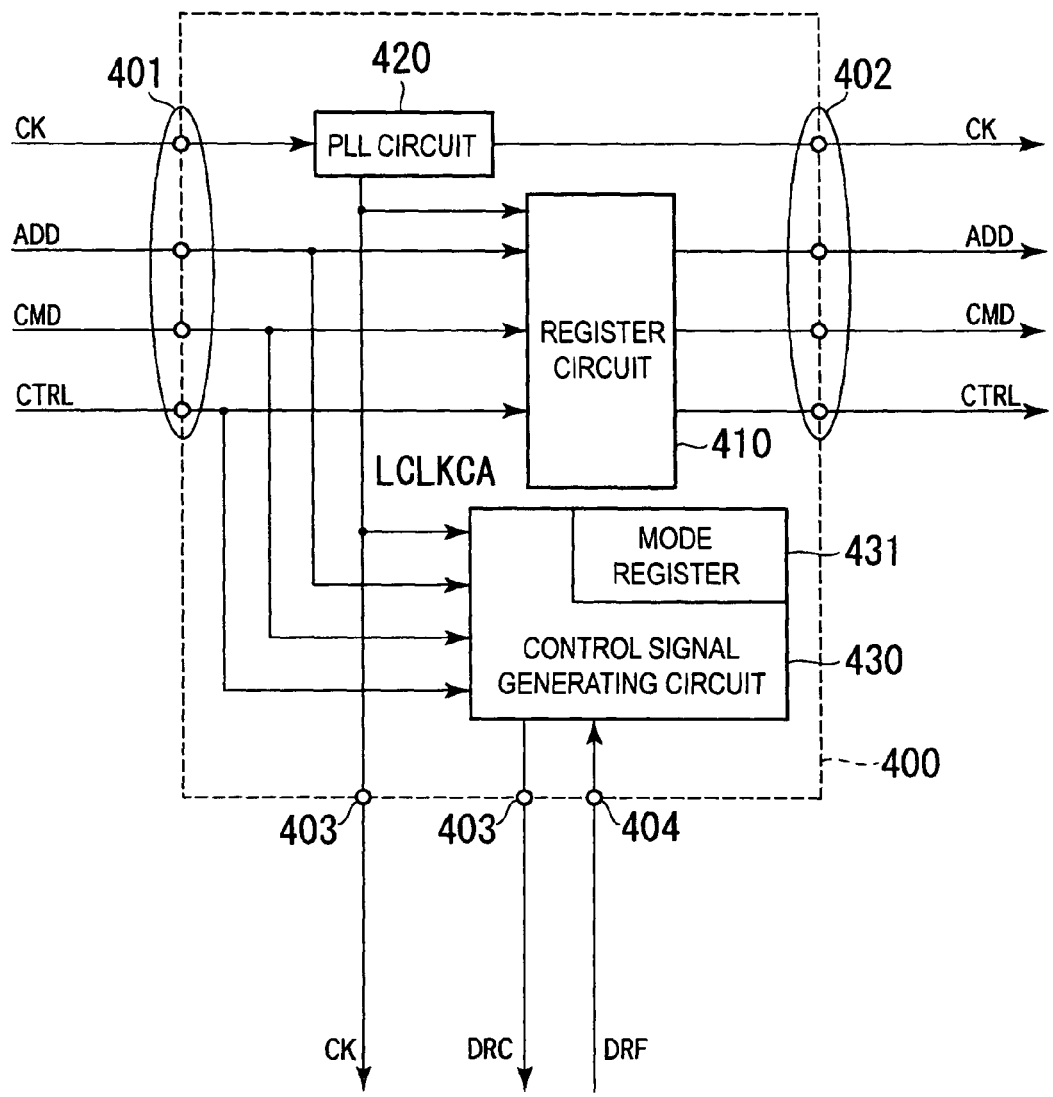
FIG. 6 is a block diagram of the configuration of the command/address/control register buffer 400.

FIG. 6 is a block diagram of the configuration of the command/address/control register buffer 400.

As shown in FIG. 6, the command/address/control register buffer 400 includes the input terminal 401 for connecting to the command/address/control connectors 130, the output terminal 402 for connecting to the memory chip 200, and the output terminal 403 and an input terminal 404 for connecting to the data register buffer 300.

The command/address/control signal that is supplied from the memory controller 12 is input from the input terminal 401. Among input command/address/control signals, the command signal CMD, the address signal ADD, and the control signal CTRL are supplied to a register circuit 410, and the clock signal CK is supplied to a PLL circuit 420. The register circuit 410 is a circuit that buffers the command signal CMD, the address signal ADD, and the control signal CTRL, and the buffered command signal CMD, address signal ADD, and control signal CTRL are supplied to the memory chip 200 via the output terminal 402.

An operation timing of the register circuit 410 is defined by an internal clock LCLKCA that is generated by the PLL circuit 420. The PLL circuit 420 is a circuit that generates the internal clock LCLKCA based on the clock signal CK supplied from the memory controller 12 having the same circuit configuration and function as that of the DLL circuit 212 provided in the memory chip 200. It is selected based on a set content in a mode register 431 that is included in a control signal generating circuit 430 whether to use the PLL circuit 420. The PLL circuit 420 can be replaced with a DLL circuit.

The control signal generating circuit 430 is a circuit that generates the control signal DRC to be supplied to the data register buffer 300 based on the command/address/control signal supplied via the input terminal 401, of which an operation is performed in synchronization with the internal clock LCLKCA. The control signal DRC for the data register buffer 300 is supplied to the data register buffer 300 via the output terminal 403. The feedback signal DRF is supplied to the control signal generating circuit 430 from the data register buffer 300 via the input terminal 404.

The control signal DRC includes signals such as a signal indicating a direction of transmitting and receiving data, a signal for controlling an ODT timing at the data line L0 side of the data register buffer 300, a signal for controlling an ODT timing at the data lines L1 and L2 side, a signal for controlling on and off of the DLL circuit, a signal for controlling enable and disable of the data register buffer 300, and a signal for performing a mode switching of the data register buffer 300 and a mode register set and the like. A separate line can be allocated to each of these signals, or a single common line can be allocated to a plurality of these signals. Alternatively, these signals can be transmitted to the data register buffer 300 as commands.

The overall configuration of the command/address/control register buffer 400 is as described above.

Figure 7:
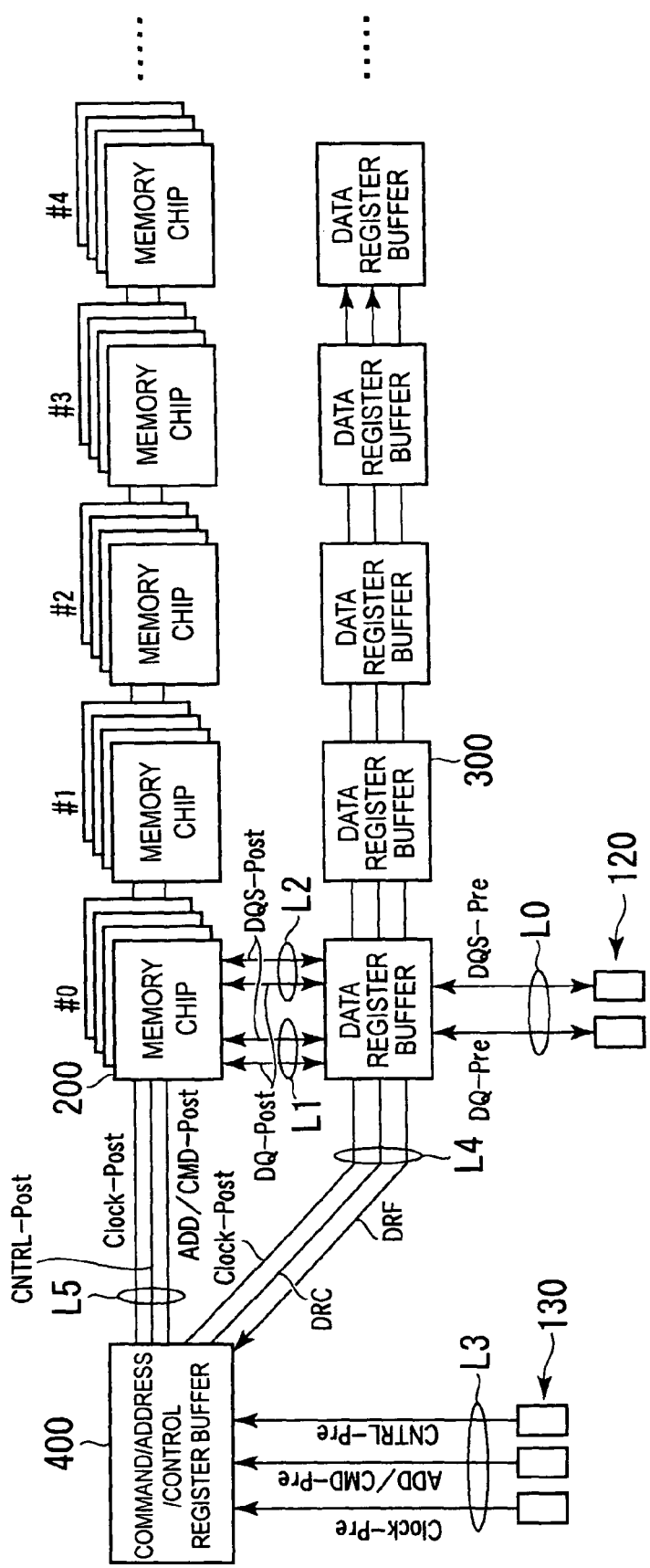
FIG. 7 is a connection diagram of the memory module 100.

FIG. 7 is a connection diagram of the memory module 100 according to the present embodiment.

As shown in FIG. 7, in the present embodiment, the data register buffer 300 intervenes between the data connectors 120 and the memory chips 200. The data connectors 120 and the data register buffer 300 are connected to each other with the data line L0, and the data register buffer 300 and the memory chips 200 are connected to each other with the data line L1 or L2. In FIG. 7, a plurality of data transferred through the data line L0 is represented by data DQ-Pre, and a plurality of data transferred through the data lines L1 and L2 is represented by data DQ-Post. Similarly, a data strobe signal transferred through the data line L0 is represented by a data strobe signal DQS-Pre, and a data strobe signal transferred through the data line L1 or L2 is represented by a data strobe signal DQS-Post.

Although the data DQ-Pre and the data DQ-Post have the same content, because the data DQ is buffered by the data register buffer 300, the timing is off between the data DQ-Pre and the data DQ-Post. The same is true for a relationship between the data strobe signal DQS-Pre and the data strobe signal DQS-Post. Therefore, in the present embodiment, it is required to perform a timing adjustment between the memory chips 200 and the data register buffer 300 and a timing adjustment between the data register buffer 300 and the memory controller in a separate manner. Details on the timing adjustments will be described later.

As described above, in the present embodiment, the four memory chips 200 are allocated to a single data register buffer 300. The four memory chips 200 are memory chips that constitute different Ranks from each other, which are exclusively activated by the chip select (CS) signal or the clock enable (CKE) signal included in the control signal CTRL. The address signal ADD and the command signal CMD are commonly supplied to the four memory chips 200.

The address signal ADD, the command signal CMD, the control signal CTRL, and the clock signal CK supplied to the memory chips 200 are supplied from the command/address/control register buffer 400. The control signal DRC supplied to the data register buffer 300 is also supplied from the command/address/control register buffer 400.

As shown in FIG. 7, the command/address/control connectors 130 and the command/address/control register buffer 400 are connected to each other with the command/address/control line L3, the command/address/control register buffer 400 and the data register buffer 300 are connected to each other with a control line L4, and the command/address/control register buffer 400 and the memory chips 200 are connected to each other with a command/address/control line L5. In FIG. 7, a command/address/control signal transferred through the command/address/control line L3 is represented by a command/address signal ADD/CMD-Pre, and a command/address signal transferred through the command/address/control line L5 is represented by a command/address signal ADD/CMD-Post. Similarly, a control signal transferred through the command/address/control line L3 is represented by a control signal CNTRL-Pre, and a control signal transferred through the command/address/control line L5 is represented by a control signal CNTRL-Post.

The clock signal CK to be supplied to the memory chip 200 and the data register buffer 300 is supplied from the command/address/control register buffer 400. In FIG. 7, a clock signal transferred through the command/address/control line L3 is represented by a clock signal Clock-Pre, and a clock signal transferred through the command/address/control line L5 is represented by a clock signal Clock-Post.

Figure 8A:
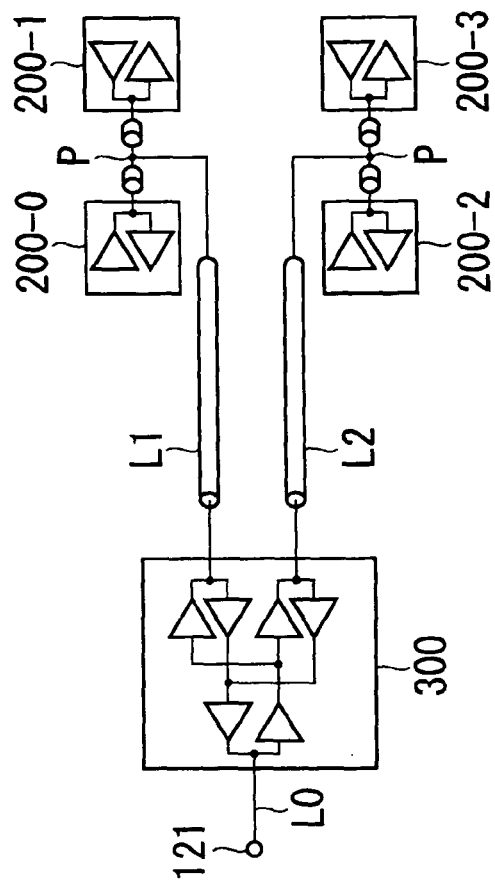
FIGS. 8A and 8B are schematic diagrams for explaining a data transfer path for transferring 1-bit data in the memory module 100 according to the present embodiment, where
Figure 8B:
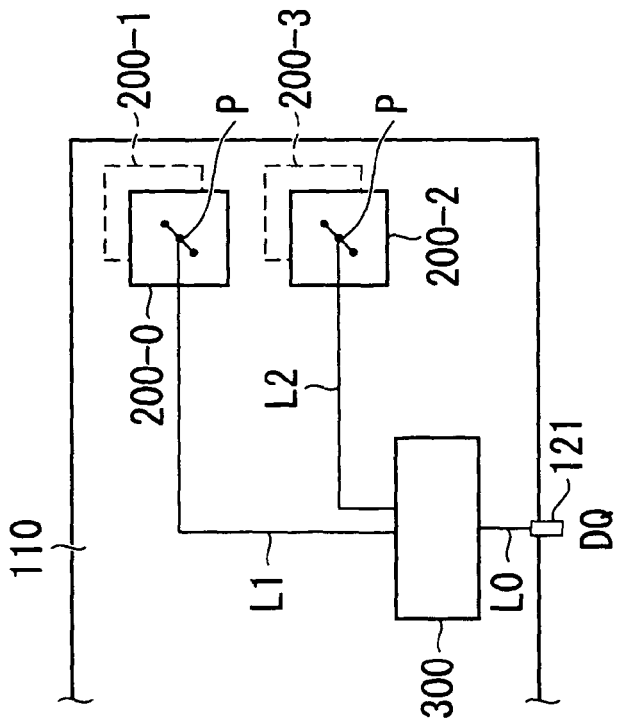

FIGS. 8A and 8B are schematic diagrams for explaining a data transfer path for transferring 1-bit data in the memory module 100 according to the present embodiment, where FIG. 8A is a layout diagram and FIG. 8B is a connection diagram.

As shown in FIGS. 8A and 8B, the 1-bit data is transferred via a predetermined connector 121 of the data connectors 120. The connector 121 is connected to the data register buffer 300 via a single data line L0. As explained above referring to FIG. 5, in the present embodiment, two data lines L1 and L2 are allocated to a single data line L0. Specifically, the data line L1 is commonly connected to the memory chips 200-0 and 200-1, and the data line L2 is commonly connected to the memory chips 200-2 and 200-3.

With the above configuration, the load capacity of a single data line L1 or L2 is reduced, the number of branch points decreases, and a line length from a branch point is shortened. As a result, the signal quality of data transferred on the data lines L1 and L2 is enhanced. Specifically, terminals connected to the single data line L1 are only three terminals total including data input/output terminals of the memory chips 200-0 and 200-1 and a data output terminal of the data register buffer 300. Furthermore, because the memory chips 200-0 and 200-1 are arranged facing each other across the module PCB 110, as shown in FIG. 8A, if a branch point P is arranged in an area sandwiched by the memory chips 200-0 and 200-1, the line length from the branch point to each of the memory chips 200-0 and 200-1 is considerably shortened. In addition, because the memory chips 200-0 to 200-3 are mounted at positions close to each other, a perspective difference in edges of the memory chips 200-0 to 200-3 is also suppressed to the minimum.

Figure 9B:
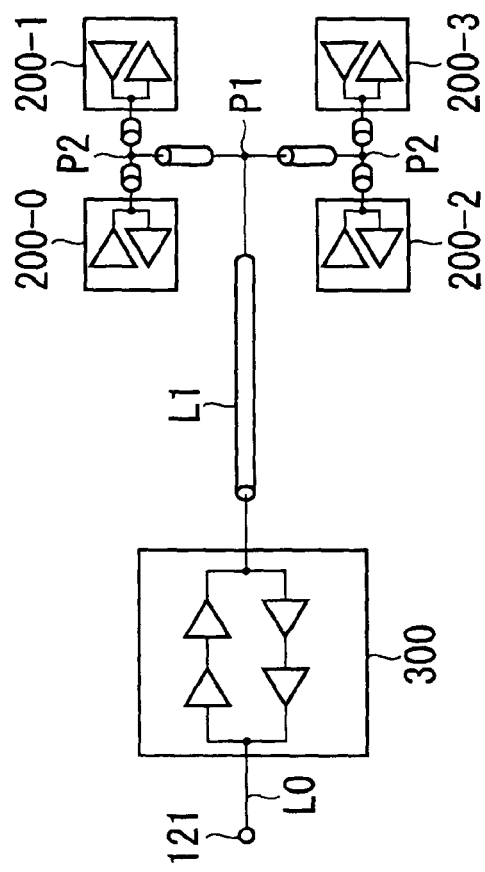
FIGS. 9A and 9B are schematic diagrams for explaining a data transfer path for transferring 1-bit data when the data lines L1 and L2 are put together in a single data line, where
Figure 9A:
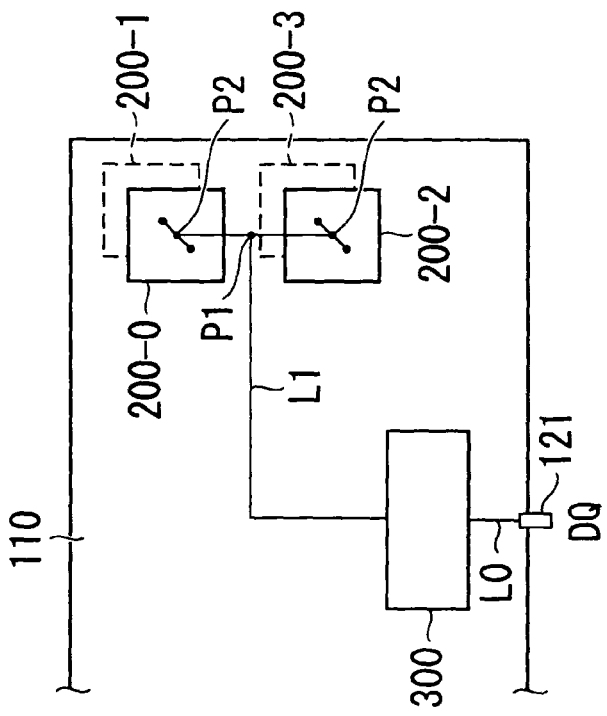

FIGS. 9A and 9B are schematic diagrams for explaining a data transfer path for transferring 1-bit data when the data lines L1 and L2 are put together in a single data line, where FIG. 9A is a layout diagram and FIG. 9B is a connection diagram.

As shown in FIGS. 9A and 9B, when the data lines L1 and L2 are put together in a single data line L1, the data register buffer 300 and the four memory chips 200-0 to 200-3 are commonly connected with the single data line L1. Therefore, as compared to the configuration shown in FIGS. 8A and 8B, the load capacity of the single data line L1 increases, the number of branch points increases, and the line length from the branch point also increases. Specifically, terminals connected to the single data line L1 become five terminals total including data input/output terminals of the memory chips 200-0 to 200-3 and the data output terminal of the data register buffer 300. In addition, because the configuration becomes such that the line is branched into two at a branch point P1 and further branched into two at a branch point P2, a line length from the branch point P1 to each of the memory chips 200-0 to 200-3 increases.

On the other hand, in the present embodiment, because the two data lines L1 and L2 are employed, as shown in FIGS. 8A and 8B, the signal quality of data in the module PCB can be enhanced. Using the two data lines L1 and L2 doubles the number of lines for connecting the memory chips 200 and the data register buffer 300. However, in the present embodiment, because the memory chips 200 and the data register buffer 300 constituting the same group G are arranged in the direction of the short side on the module PCB 110 as explained referring to FIG. 1, there is an enough room for the line space. Therefore, even if the number of lines extending in the direction of the short side is doubled, it is possible to form the lines without difficulty.

Meanwhile, when a layout is taken in which data are concentrated in the center of the module PCB, as in the case of the Fully Buffered memory module, it is required to form a plurality of long data lines in the direction of the long side of the module PCB. In such a layout, because the total length of the data lines increases by a considerable amount as compared to the layout of the present embodiment, it is required to take a measure such as significantly increasing the number of insulating layers forming the module PCB in order to double the number of the data lines. However, according to the present embodiment, because it does not cause such a problem, it is possible to double the number of lines for connecting the memory chips 200 and the data register buffer 300 without increasing the number of insulating layers forming the module PCB 110.

Figure 10:
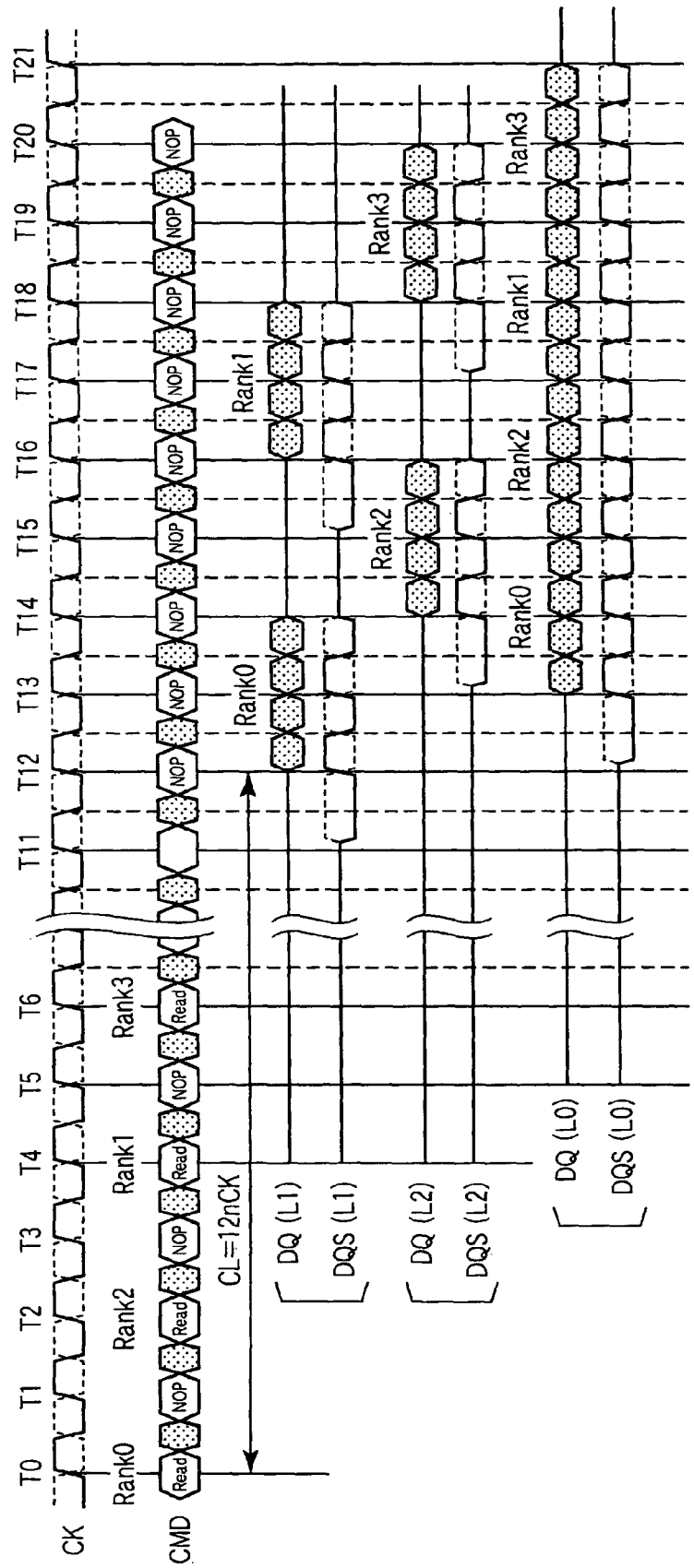
FIG. 10 is a timing chart for explaining an interleaving operation using the two data lines L1 and L2.

FIG. 10 is a timing chart for explaining an interleaving operation using the two data lines L1 and L2.

FIG. 10 shows a consecutive read operation from a Rank0 to a Rank3 with a case that a burst length is 4 bits (BL=4) (or a case that a burst operation is stopped at 4 bits by a burst chop). In the example shown in FIG. 10, a read command is issued at times T0, T2, T4, and T6 that are synchronized with the clock signal CK in the order of the Rank0, the Rank2, the Rank1, and the Rank3. In response to these read commands, after a lapse of a predetermined CAS latency (in this example, CL=12), 4-bit read data DQ is burst output.

As a result, in a period from a time T12 to a time T14, a data transfer is performed from the memory chip 200 of the Rank0 using the data line L1, in a period from the time T14 to a time T16, a data transfer is performed from the memory chip 200 of the Rank2 using the data line L2, in a period from the time T16 to a time T18, a data transfer is performed from the memory chip 200 of the Rank1 using the data line L1, and in a period from the time T18 to a time T20, a data transfer is performed from the memory chip 200 of the Rank3 using the data line L2. That is, the data lines L1 and L2 are used in an alternate manner.

The read data sequentially transferred in the above manner are supplied to the data register buffer 300, and after being buffered in a FIFO circuit included in the data register buffer 300, output to the data line L0. In the example, shown in FIG. 10, since the read data is input to the data register buffer 300, the read data is output with one cycle delay.

In this manner, in the present embodiment, because the interleaving operation can be performed using the two data lines L1 and L2, it is possible to perform a read operation for a plurality of memory chips without interruption. As a result, the read data output from the data register buffer 300 can also be supplied to the memory controller without interruption, so that the usage efficiency of a bus can be enhanced. Although the data lines L1 and L2 are not simultaneously used in the present embodiment, if the data lines L1 and L2 are put together in a single data line, it is required to spare a time equal to or longer than one cycle between read data output from different memory chips. On the other hand, in the present embodiment, because the two data lines L1 and L2 are alternately used, it is not necessary to put a time between read data output from different memory chips.

Although the read operation is explained as an example in FIG. 10, a similar interleaving operation can be applied for a write operation.

The operation of the memory module 100 according to the present embodiment is explained below in more detail.

Figure 11:
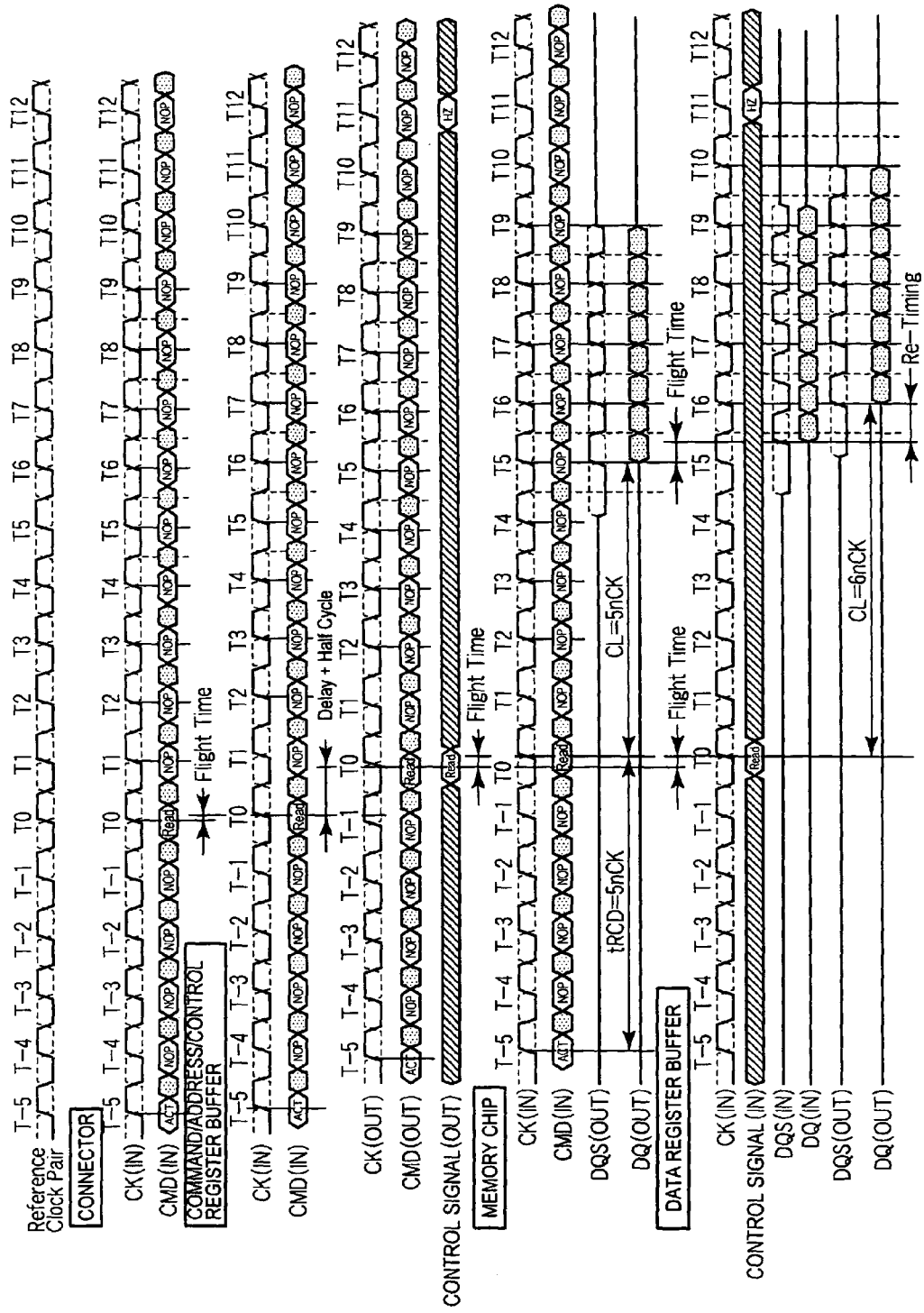
FIG. 11 is a timing chart for explaining a read operation of the memory module 100 according to the present embodiment.

FIG. 11 is a timing chart for explaining a read operation of the memory module 100 according to the present embodiment.

In the read operation, an active command ACT and a read command Read are issued in order from the memory controller 12. In the example shown in FIG. 11, the active command ACT reaches the command/address/control connectors 130 at a time T-5 that is synchronized with the clock signal CK, and the read command Read reaches the command/address/control connectors 130 at a time T0.

The commands ACT and Read reaching the command/address/control connectors 130 are input to the command/address/control register buffer 400. At this moment, there occurs a predetermined time difference (Flight Time) between a timing at which the commands ACT and Read reaches the command/address/control connectors 130 and a timing at which the commands ACT and Read are input to the command/address/control register buffer 400.

The command/address/control register buffer 400 registers the received commands ACT and Read with an input clock signal in the register circuit 410 shown in FIG. 6, and then outputs them to the memory chip 200. At this time, a synchronization with the output of the commands ACT and Read is taken by delaying the output of the clock signal CK by an amount equivalent to an additional ½ clock cycle. In addition, the command/address/control register buffer 400 supplies a read command Read to the data register buffer 300 as a part of the control signal DRC.

The memory chip 200 receives the commands ACT and Read, and starts an actual read operation. At this moment, there occurs a predetermined time difference (Flight Time) between a timing at which the commands ACT and Read are output from the command/address/control register buffer 400 and a timing at which the commands ACT and Read are input to the memory chip 200.

Because CL=5 in the example shown in FIG. 11, the memory chip 200 starts a burst output of read data DQ at a time T5 in five clock cycles after receiving the read command Read. In the example shown in FIG. 11, the burst length is 8 bits (BL=8). The read data DQ and a data strobe signal DQS burst output from the memory chip 200 are supplied to the data register buffer 300.

The data register buffer 300 loads the read data DQ that is output from the memory chip 200 in the FIFO (Read) circuit 302 with a data strobe signal DQS that is delayed by a predetermined phase amount (for example, phase difference of about 90 degrees). At this moment, there occurs a predetermined time difference (Flight Time) between a timing at which the read data DQ and the data strobe signal DQS are output from the memory chip 200 and a timing at which the read data DQ and the data strobe signal DQS are input to the data register buffer 300.

Thereafter, the data register buffer 300 performs a re-timing in synchronization with the internal clock LCLKR using the FIFO (Read) circuit 302 to convert CL into CL=6, and outputs the read data DQ and the data strobe signal DQS. With this configuration, it becomes possible for the memory controller to receive the read data DQ in a correct manner.

The read operation of the memory module 100 according to the present embodiment is as described above. A write operation of the memory module 100 is explained next.

Figure 12:
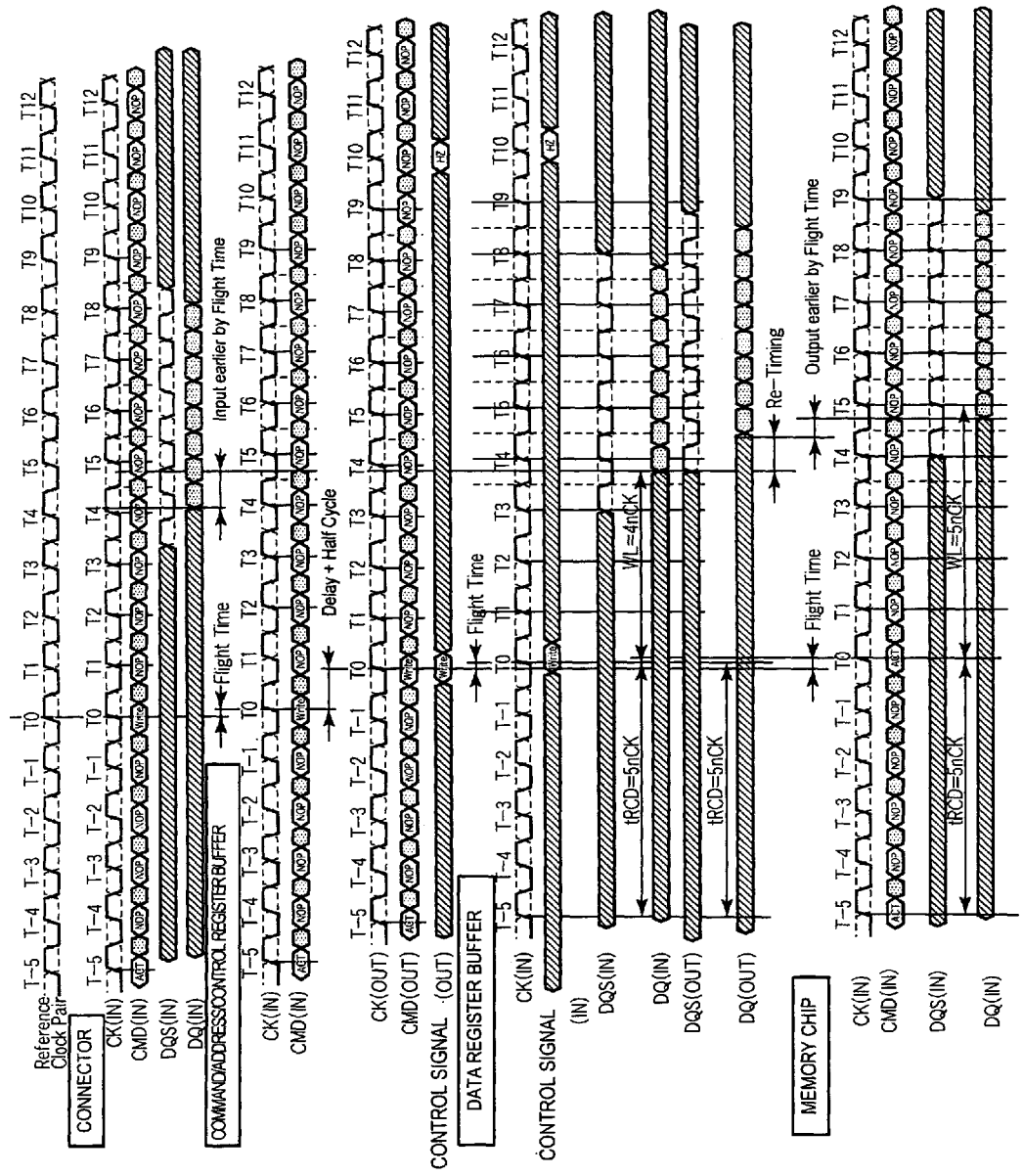
FIG. 12 is a timing chart for explaining the write operation of the memory module 100 according to the present embodiment.

FIG. 12 is a timing chart for explaining the write operation of the memory module 100 according to the present embodiment.

In the write operation, the memory controller issues an active command ACT and a write command Write in order, and after a lapse of a write latency (WL) since the write command Write is issued, burst outputs write data. In the example shown in FIG. 12, the active command ACT reaches the command/address/control connectors 130 at the time T-5 that is synchronized with the clock signal CK, and the write command Write reaches the command/address/control connectors 130 at the time T0. In this example, WL=4, so that write data DQ is input to the data connectors 120 from a time T4.

Because a flow of the command is similar to that in the read operation shown in FIG. 11, redundant explanations will be omitted. The write data DQ reaching the data connectors 120 is input to the data register buffer 300. At this moment, there occurs a time difference (Flight Time) between a timing at which the write command reaches the command/address/control connectors 130 and a timing at which the write command (Direction Control) is input to the data register buffer 300. In consideration of this point, the memory controller outputs the write data DQ by delaying it by an amount equivalent to the Flight Time.

The data register buffer 300 loads the received write data DQ in the FIFO (Write) circuit 301 with a data strobe signal DQS that is delayed by a predetermined phase amount (for example, phase difference of about 90 degrees). The data register buffer 300 then performs a re-timing in synchronization with the internal clock LCLKW using the FIFO (Write) circuit 301 to convert WL into WL=5, and outputs the write data DQ and the data strobe signal DQS. As described above, the write data is transferred from the data register buffer 300 to the memory chip 200 using either one of the two data lines L1 and L2. The data line to be used is determined by a designated Rank.

The memory chip 200 receives the write data DQ that is burst output from the data register buffer 300, and writes it in the memory cell array. At this time, there occurs a predetermined time difference (Flight Time) between a timing at which the write data DQ and the data strobe signal DQS are output from the data register buffer 300 and a timing at which the write data DQ and the data strobe signal DQS are input to the memory chip 200. In consideration of this point, the data register buffer 300 outputs the write data DQ earlier by an amount equivalent to the Flight Time. With this configuration, it becomes possible for the memory chip 200 to receive the write data DQ in a correct manner.

An initializing operation of the memory module 100 according to the present embodiment at the time of activation is explained next.

Figure 13:
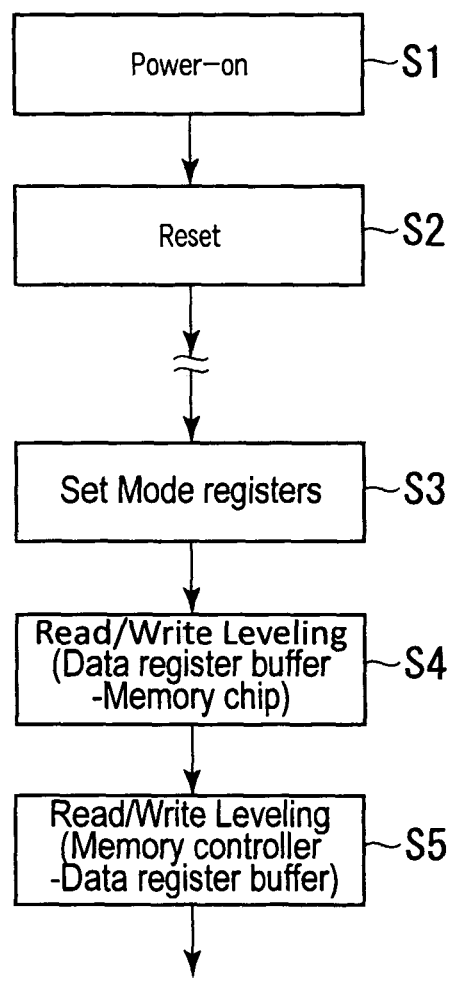
FIG. 13 is a flowchart for explaining the initializing operation of the memory module 100 at the time of activation.

FIG. 13 is a flowchart for explaining the initializing operation of the memory module 100 at the time of activation.

With a power-on of the system (Step S1), each of the memory chip 200, the data register buffer 300, and the command/address/control register buffer 400 internally activates a reset signal to reset the internal circuit (Step S2). By resetting the internal circuit, each of the memory chip 200, the data register buffer 300, and the command/address/control register buffer 400 performs the initializing operation. The initializing operation includes a mode register setting operation by which predetermined mode information is set in the mode registers 215, 321, and 431 that are included in the memory chip 200, the data register buffer 300, and the command/address/control register buffer 400, respectively (Step S3).

Upon completing the mode register setting operation, a leveling operation between the data register buffer 300 and the memory chip 200 is performed (Step S4). The leveling operation is to adjust a write timing or a read timing in consideration of a propagation time of a signal. The adjustment of the write timing is performed by a write leveling operation, and the adjustment of the read timing is performed by a read leveling operation.

When the leveling operation between the data register buffer 300 and the memory chip 200 is completed, a leveling operation between the memory controller and the data register buffer 300 is performed (Step S5).

Figures 14A, 14B:
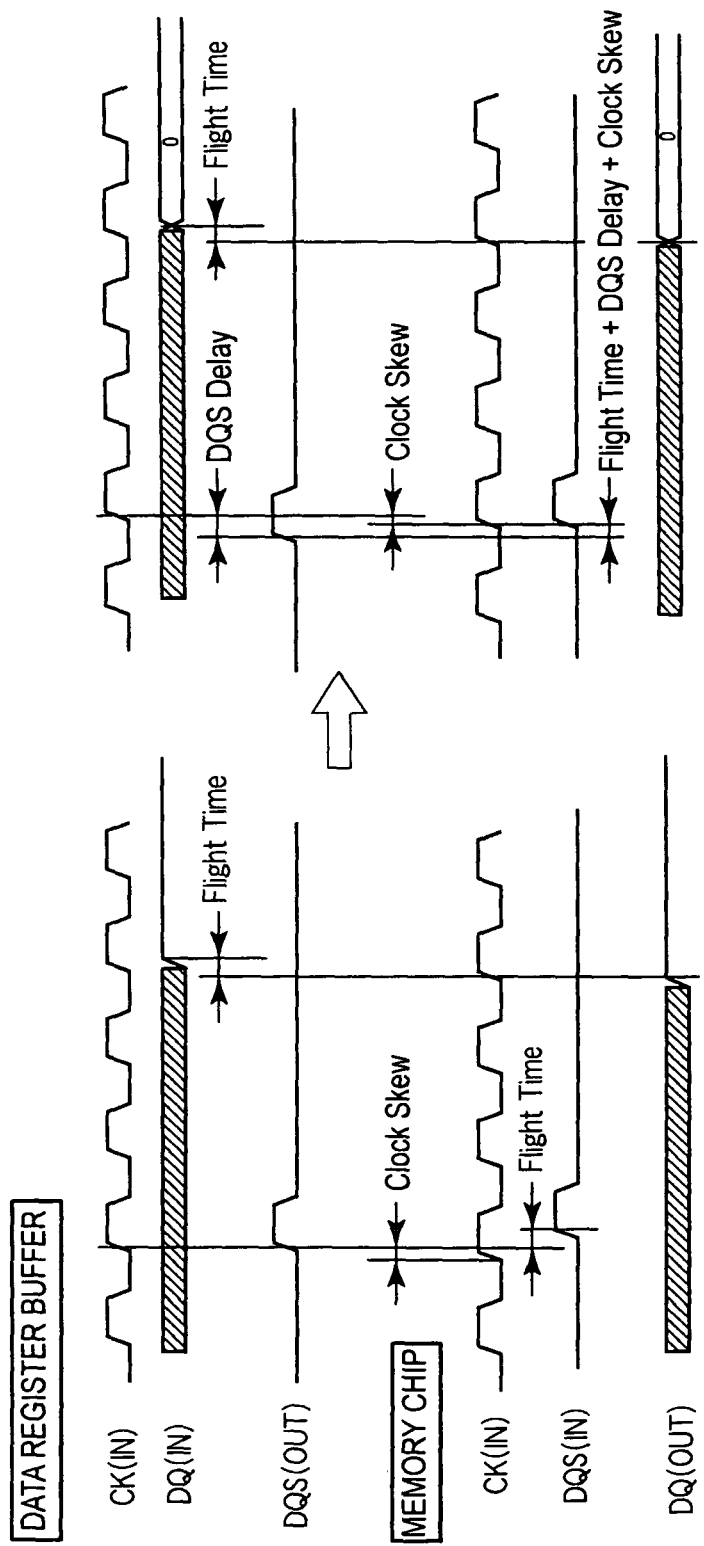
FIGS. 14A and 14B are timing charts for explaining the write leveling operation between the data register buffer 300 and the memory chip 200, where

FIGS. 14A and 14B are timing charts for explaining the write leveling operation between the data register buffer 300 and the memory chip 200, where FIG. 14A is a timing chart at the time of starting the leveling and FIG. 14B is a timing chart at the time of ending the leveling. This operation is performed by the write leveling circuit 322 shown in FIG. 5.

In the write leveling operation between the data register buffer 300 and the memory chip 200, as shown in FIG. 14A, the data register buffer 300 outputs a data strobe signal DQS that is synchronized with the clock signal CK. The clock signal CK is a signal that is supplied from the command/address/control register buffer 400, which is also supplied to the memory chip 200 as described above. Because it takes a certain amount of propagation time until the data strobe signal DQS reaches the memory chip 200, input timings of the clock signal CK and the data strobe signal DQS are not always the same on the memory chip 200 side.

In the example in FIG. 14A, there is shown a case that a logical level of the clock signal CK at a rising edge of the data strobe signal DQS is "High level". In response to the logical level of the clock signal CK, the memory chip 200 outputs a signal DQ of "High level" from the data input/output terminal 204. The signal DQ is input to the data register buffer 300, by which the data register buffer 300 can find a direction of phase shift of the clock signal CK and the data strobe signal DQS.

The write leveling circuit 322 of the data register buffer 300 changes an output timing of the data strobe signal DQS by displacing the internal clock LCLKW based on the direction of the phase shift. In the example shown in FIG. 14A, because the data strobe signal DQS is retarded as compared to a rising edge of the clock signal CK reaching the memory chip 200, the data register buffer 300 advances the output timing of the data strobe signal DQS.

By repeating the above operation, as shown in FIG. 14B, the logical level of the clock signal CK is changed to "Low level" at the rising edge of the data strobe signal DQS on the memory chip 200 side. This leads to an end of the write leveling operation, and the data register buffer 300 can find a timing to output the data strobe signal DQS based on the input clock signal CK. A result of the write leveling operation is stored in the data register control circuit 320 in the data register buffer 300. Upon completing the write leveling operation in this manner, the phases of the clock signal CK and the data strobe signal DQS input to the memory chip 200 are substantially matched with each other.

Figure 15:
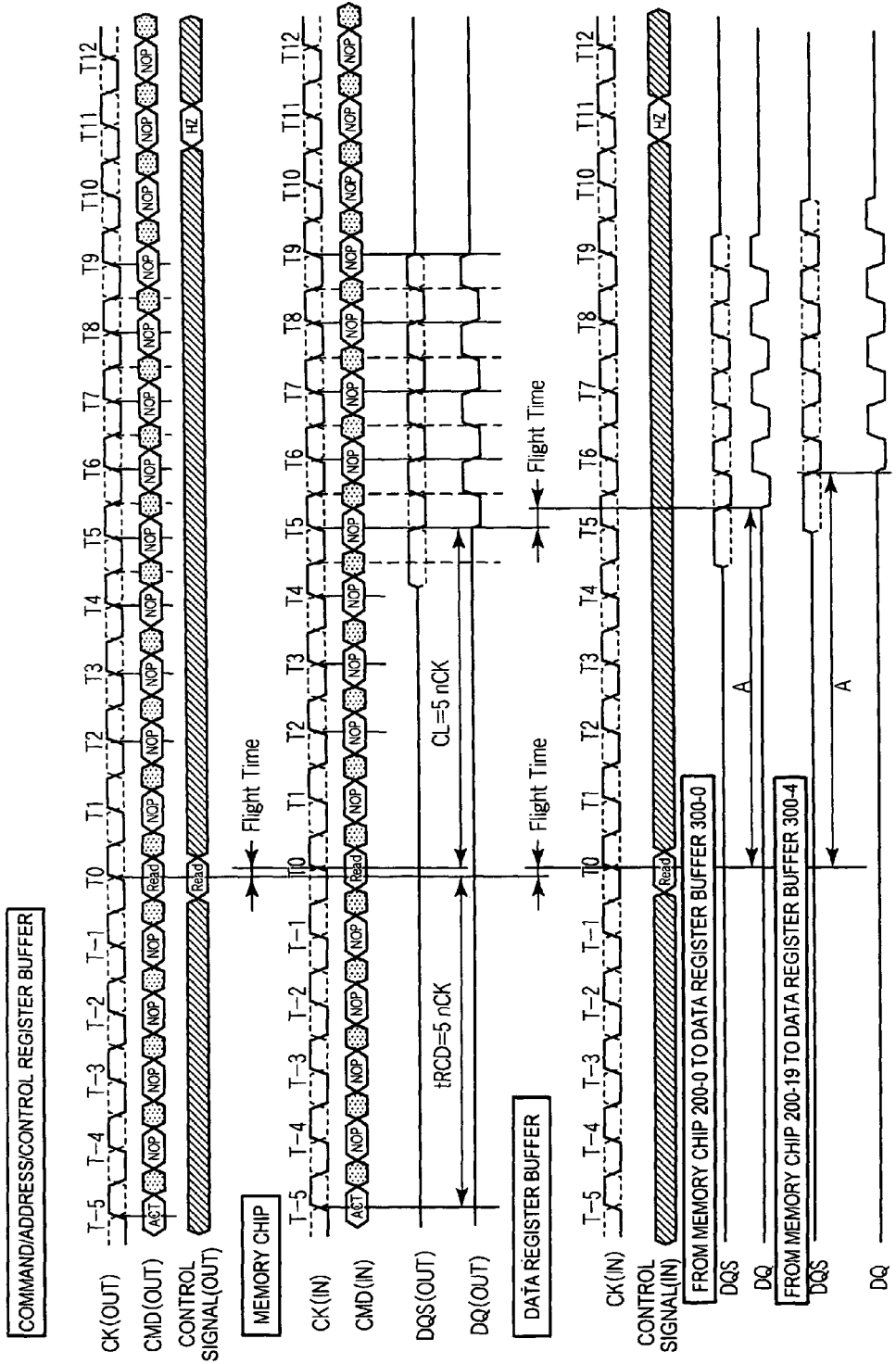
FIG. 15 is a timing chart for explaining the read leveling operation between the data register buffer 300 and the memory chip 200.

FIG. 15 is a timing chart for explaining the read leveling operation between the data register buffer 300 and the memory chip 200. This operation is performed by the read leveling circuit 323 shown in FIG. 5.

In the read leveling operation between the data register buffer 300 and the memory chip 200, as shown in FIG. 15, the command/address/control register buffer 400 outputs the clock signal CK, and at the same time, issues the active command ACT and the read command Read. The clock signal CK is supplied to the memory chip 200 and the data register buffer 300, and the commands ACT and Read are supplied to the memory chip 200. The read command Read is also supplied to the data register buffer 300 as a part of the control signal DRC.

In the example shown in FIG. 15, the active command ACT is issued at the time T-5 that is synchronized with the clock signal CK, and the read command Read is issued at the time T0. Therefore, a RAS-CAS delay (tRCD) is five clock cycles.

The memory chip 200 receives the read command Read and performs an actual read operation. In the example shown in FIG. 15, the CAS latency is set to five clock cycles (CL=5), so that an output of read data DQ begins at the time T5. The read data DQ at the time of the read leveling is, for example, a signal in which a High level and a Low level are repeated in an alternate manner.

The read data DQ output from the memory chip 200 reaches the data register buffer 300, by which the data register buffer 300 can find a time A from an input timing of the read command Read that is input as a part of the control signal DRC until the read data DQ is input. The time is measured for each of the memory chips 200, stored in the data register control circuit 320 in the data register buffer 300, and used in an adjustment of an activation timing of the input buffer circuit INB and the like. In FIG. 15, two cases are shown including a first case that the time A from the input of the read command Read until the input of the read data DQ is short (between the memory chip 200-0 and the data register buffer 300-0) and a second case that the time A is long (between the memory chip 200-19 and the data register buffer 300-4).

Figures 16A, 16B:
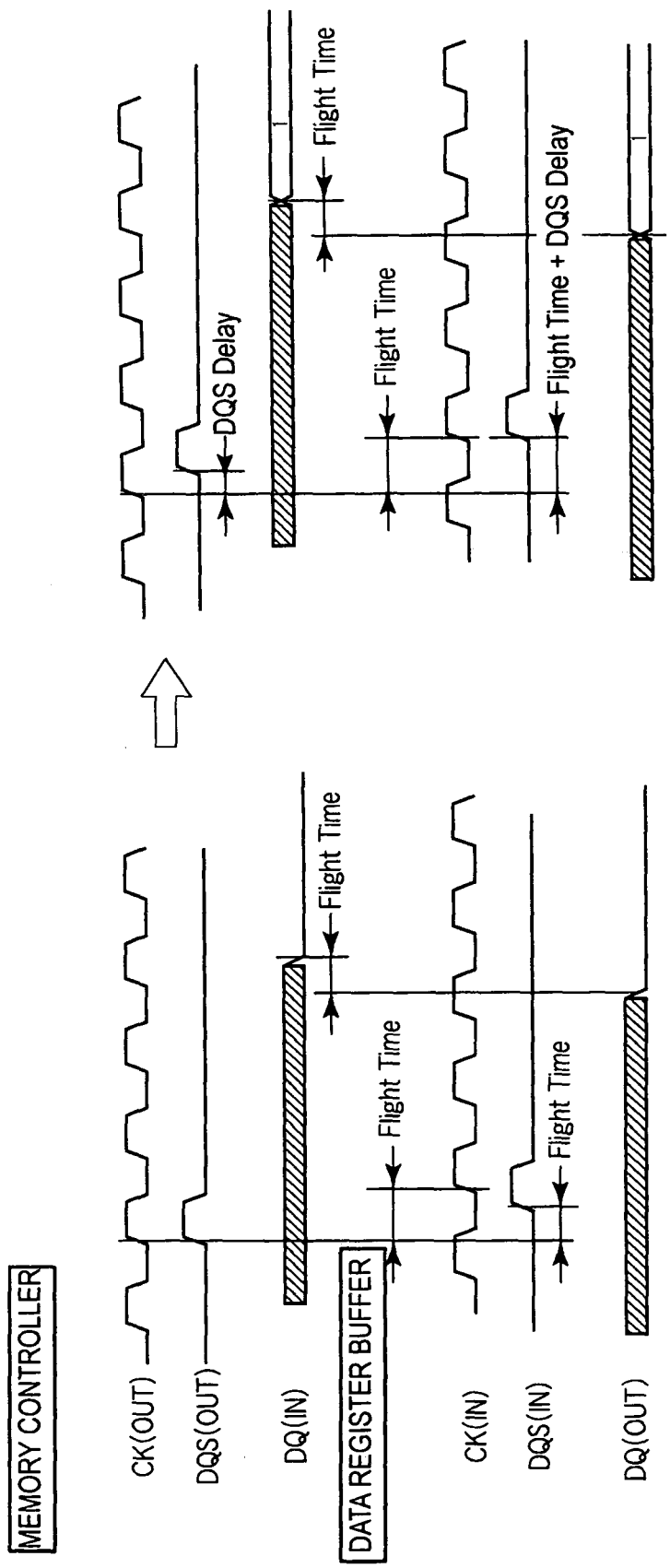
FIGS. 16A and 16B are timing charts for explaining the write leveling operation between the memory controller 12 and the data register buffer 300, where

FIGS. 16A and 16B are timing charts for explaining the write leveling operation between the memory controller 12 and the data register buffer 300, where FIG. 16A is a timing chart at the time of starting the leveling and FIG. 16B is a timing chart at the time of ending the leveling. This operation is performed by a write leveling circuit 12a shown in FIG. 2.

In the write leveling operation between the memory controller 12 and the data register buffer 300, as shown in FIG. 16A, the memory controller 12 outputs the clock signal and the data strobe signal DQS. The clock signal CK is supplied to the data register buffer 300 via the command/address/control register buffer 400, and the data strobe signal DQS is directly supplied to the data register buffer 300. Therefore, input timings of the clock signal CK and the data strobe signal DQS are not always the same on the data register buffer 300 side.

In the example shown in FIG. 16A, on the data register buffer 300, a case that in which the logical level of the clock signal CK at the rising edge of the data strobe signal DQS is "Low level". In response to the logical level of the clock signal CK, the data register buffer 300 outputs a signal DQ of "Low level" from the input/output terminal 340. The signal DQ is supplied to the memory controller 12, by which the memory controller 12 can find a direction of phase shift of the clock signal CK and the data strobe signal DQS.

The memory controller 12 changes an output timing of the data strobe signal DQS based on the direction of the phase shift. In the example shown in FIG. 16A, because the data strobe signal DQS reaches the data register buffer 300 earlier than the rising edge of the clock signal CK reaching the data register buffer 300, the memory controller 12 delays the output timing of the data strobe signal DQS.

By repeating the above operation, as shown in FIG. 16B, the logical level of the clock signal CK is changed to "High level" at the rising edge of the data strobe signal DQS on the data register buffer 300 side. This leads to an end of the write leveling operation, and the memory controller 12 can find a timing to output the data strobe signal DQS based on the clock signal CK that is output from the memory controller 12 itself. A result of the write leveling operation is stored in an internal circuit of the memory controller 12. Upon completing the write leveling operation in this manner, the phases of the clock signal CK and the data strobe signal DQS input to the data register buffer 300 are substantially matched with each other.

Figure 17:
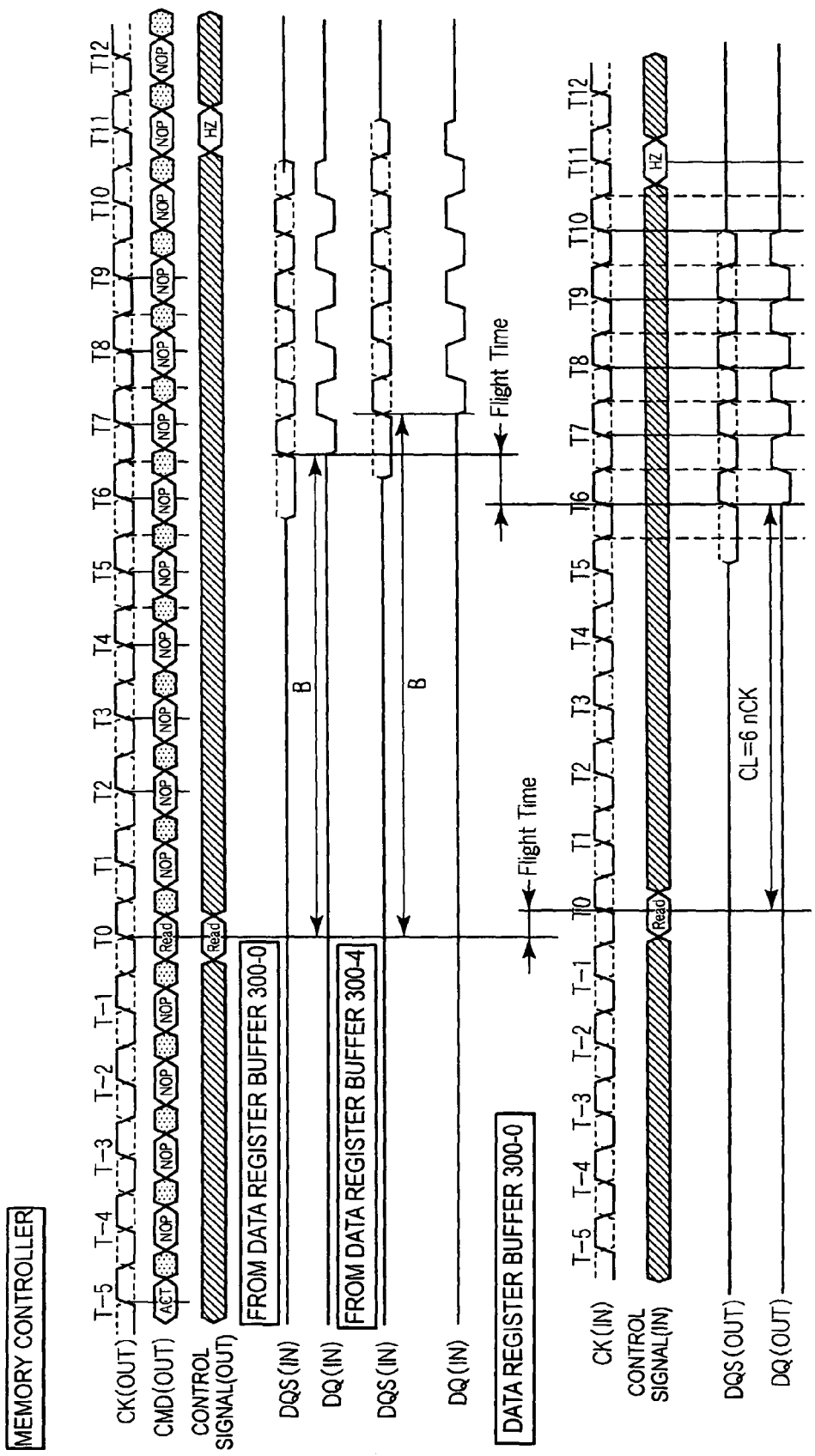
FIG. 17 is a timing chart for explaining the read leveling operation between the memory controller 12 and the data register buffer 300.

FIG. 17 is a timing chart for explaining the read leveling operation between the memory controller 12 and the data register buffer 300. This operation is performed by a read leveling circuit 12b shown in FIG. 2.

In the read leveling operation between the memory controller 12 and the data register buffer 300, as shown in FIG. 17, the memory controller 12 outputs the clock signal CK, and at the same time, issues an active command ACT and a read command Read. The clock signal CK is supplied to the data register buffer 300, and the commands ACT and Read are supplied to the data register buffer 300 via the command/address/control register buffer 400 as a part of the control signal DRC.

In the example shown in FIG. 17, the active command ACT is issued at the time T-5 that is synchronized with the clock signal CK, and the read command Read is issued at the time T0. Therefore, a RAS-CAS delay (tRCD) is five clock cycles.

The data register buffer 300 receives the read command Read, and after a lapse of a predetermined CAS latency, outputs dummy data DQ. The dummy data DQ is not the read data read out from the memory chip 200 but data that is automatically generated by the data register control circuit 320 in the data register buffer 300. In the example shown in FIG. 17, the CAS latency is set to six clock cycles (CL=6), so that an output of the dummy data DQ begins at a time T6. The dummy data DQ is, for example, a signal in which a High level and a Low level are repeated in an alternate manner.

The dummy data DQ output from the data register buffer 300 reaches the memory controller 12, by which the memory controller 12 can find a time B from an issuance timing of the read command Read until the read data DQ is input. The time is measured for each of the data register buffers 300, stored in the internal circuit of the memory controller 12, and used in an adjustment of an activation timing of an input buffer circuit (not shown) and the like. In FIG. 17, two cases are shown including a first case that the time B from the issuance of the read command Read until the input of the read data DQ is short (between the memory controller 12 and the data register buffer 300-0) and a second case that the time B is long (between the memory controller 12 and the data register buffer 300-4).

The initializing operation of the memory module 100 according to the present embodiment is as described above. A relationship between the DLL circuit and the ODT function of the memory module 100 according to the present invention is explained next.

As described above, the DLL circuit is a circuit that generates an internal clock signal of which a phase is controlled with respect to an external clock signal, which is used for matching the phases of the read data DQ and the data strobe signal DQS with the phase of the clock signal CK. In a recent high speed memory such as a DDR3 DRAM, a use of the DLL circuit is substantially essential. If the DLL circuit is not used, it is difficult to perform a data transfer in a proper manner. On the other hand, the DLL circuit has a problem of relatively large power consumption.

Meanwhile, the ODT function is a function of incorporating a terminating resistor inside a memory chip, which is used for preventing a degradation of signal quality due to a reflection of the signal. In a typical memory module, a large number of memory chips are commonly connected to a single data line. Therefore, in a recent high speed memory, a use of the ODT function is substantially essential. If the ODT function is set to off, a signal waveform is significantly degraded. On the other hand, if the ODT function is set to on, it causes a problem of increasing the power consumption. In addition, because the ODT operation necessitates a synchronization with a data input/output operation, the use of the DLL circuit is basically assumed.

Figure 18:
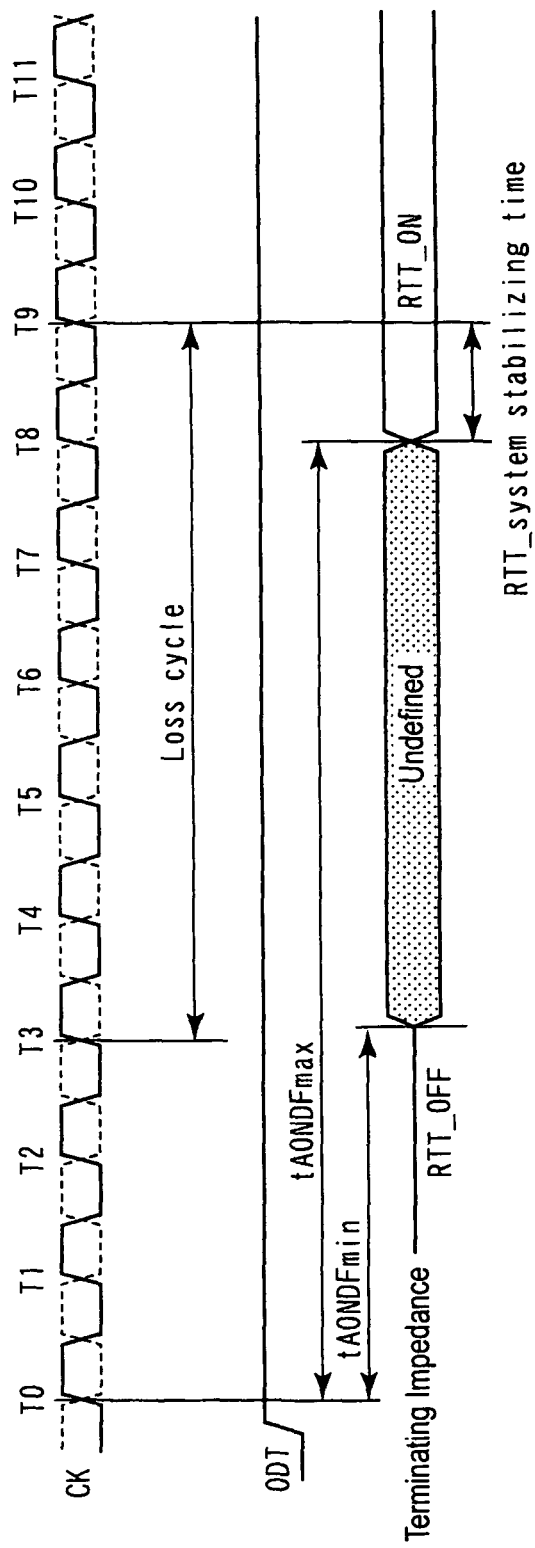
FIG. 18 is a timing chart for explaining a problem that occurs when performing the ODT operation without using the DLL circuit.

FIG. 18 is a timing chart for explaining a problem that occurs when performing the ODT operation without using the DLL circuit.

In the example shown in FIG. 18, the ODT signal is activated just before the time T0. In response to the activation of the ODT signal, the internal circuit of the memory chip 200 turns on the ODT function in synchronization with the clock signal at the time T0. However, the ODT impedance (impedances of the data input/output terminal 204 and the data strobe terminal 205) does not reach a desired value immediately, and it is not changed from a high impedance state (RTT_OFF) unless tAONDFmin passes. In the present example, the tAONDFmin is about three clock cycles.

After a lapse of the tAONDFmin, although the ODT impedance becomes no longer the high impedance state according to a condition such as the power supply voltage and the chip temperature, it still does not reach the desired impedance RTT_ON depending on the condition. Under the worst condition, the desired impedance RTT_ON is obtained after tAONDFmax passes from the time T0. In the present example, the tAONDFmax is about eight clock cycles.

Therefore, in a period from a time T3 at which the ODT impedance becomes an undefined state to a time T9 that is next to a cycle at which the ODT impedance becomes the desired value RTT, the impedance becomes undefined. Accordingly, this period becomes a loss cycle in which an access to another memory chip is not allowed. In this manner, when the ODT operation is performed without using the DLL circuit, a switching between on and off controls of the ODT function is not synchronized, resulting in an increase of the period in which the impedance is undefined during which the read/write operation is inhibited.

In consideration of the loss cycle problem described above, it is desirable not to use the ODT function when the DLL circuit is not used. However, the ODT function is substantially essential in the typical memory module, so that it is difficult to turn the function off.

However, in the memory module 100 according to the present embodiment, because the load capacities of the data lines L1 and L2 connected to the memory chip 200 are considerably small, even when a high speed memory such as a DDR3 DRAM is used, the ODT operation can be set off in an actual operation. Besides, because a distance between the memory chip 200 and the data register buffer 300 is considerably short, even if a synchronization control is not performed using a DLL circuit, it is possible to perform a data transfer in a correct manner. That is, because both the ODT function and the DLL circuit can be set to off, it is possible to reduce the power consumption by a considerable amount. In addition, because the ODT function and the DLL circuit can be eliminated from the memory chip 200, it is also possible to reduce the chip dimension.

A difference in operation timings depending on the use of the ODT function and the DLL circuit is explained next.

Figure 19:
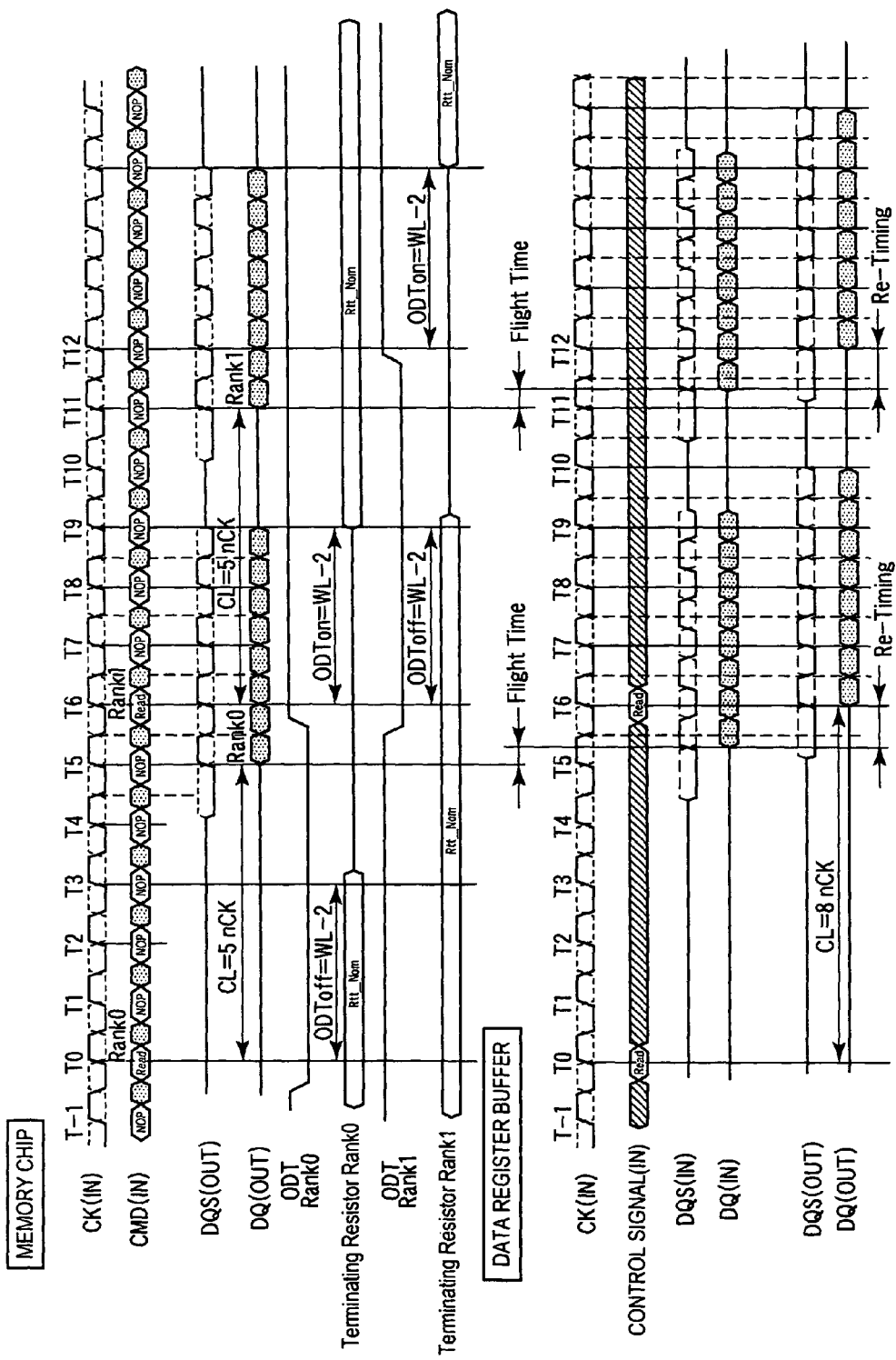
FIG. 19 is a timing chart for explaining a read-to-read operation when both the ODT function and the DLL circuit are in an ON state.

FIG. 19 is a timing chart for explaining a read-to-read operation when both the ODT function and the DLL circuit are in an ON state.

As shown in FIG. 19, a read operation timing in a state where both the ODT function and the DLL circuit are set to on is basically the same as the operation timing shown in FIG. 11. In the example shown in FIG. 19, a read command Read is issued for the Rank0 at the time T0, and another read command Read is issued for the Rank1 at the time T6. Because the memory chip 200 of the Rank0 and the memory chip 200 of the Rank1 are commonly connected to the data line L1, they cause an influence on each other.

Accordingly, in a period from the time T5 to the time T9 during which read data DQ is burst output from the memory chip 200 of the Rank0, an impedance of the data input/output terminal 204 of the memory chip 200 of the Rank1 is set to Rtt_Nom by the ODT function. Similarly, in a period from a time T11 to a time T15 during which read data DQ is burst output from the memory chip 200 of the Rank1, an impedance of the data input/output terminal 204 of the memory chip 200 of the Rank0 is set to Rtt_Nom by the ODT function.

In this manner, during the read data DQ is output from the memory chip 200 on one side, the memory chip 200 on the other side performs the ODT operation, which prevents a reflection of a signal. However, as described above, current consumption is generated due to the usage of the ODT function and the DLL circuit.

Figure 20:
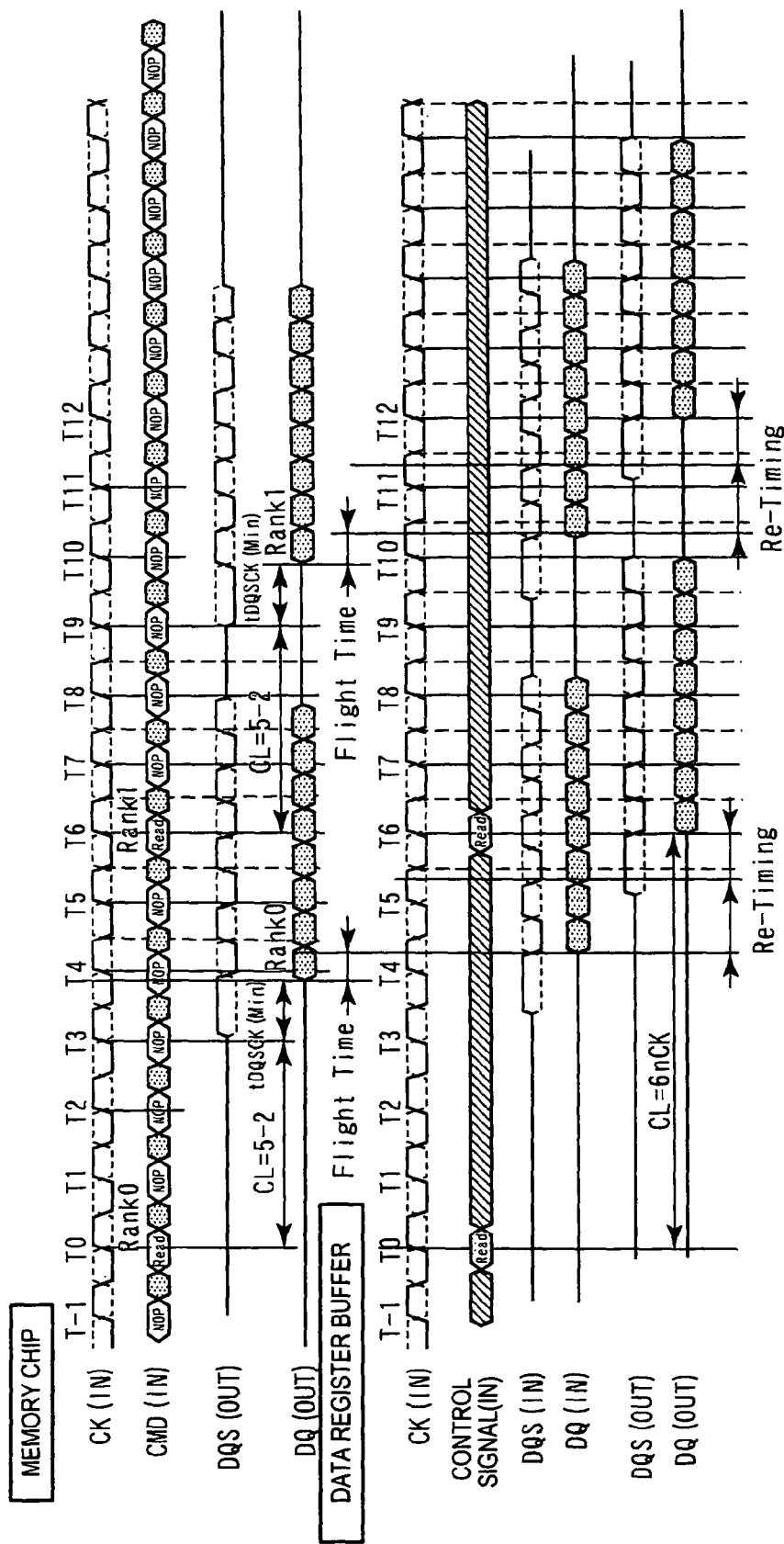
FIG. 20 is a timing chart for explaining the read-to-read operation when both the ODT function and the DLL circuit are in an OFF state.

FIG. 20 is a timing chart for explaining the read-to-read operation when both the ODT function and the DLL circuit are in an OFF state.

As shown in FIG. 20, when the DLL circuit is set to off, an output timing of the read data DQ is asynchronous with the clock signal CK. However, in the present embodiment, because the distance between the memory chip 200 and the data register buffer 300 is considerably short, the data register buffer 300 can correctly receive the read data DQ that is output in an asynchronous manner. In addition, because the memory chip of the Rank0 and the memory chip of the Rank1 are arranged at substantially the end of the data line L1, an influence of a reflection of a signal from the memory chip 200 on the non-operating side is considerably small. The read data DQ output in an asynchronous manner is subjected to a re-timing by the data register buffer 300, and then output to the memory controller 12.

In this manner, in the present embodiment, even when both the ODT function and the DLL circuit of the memory chip 200 are set to off, it is possible to perform the same read operation as in a case that the ODT function and the DLL circuit are set to on. Rather, the output timing of the read data DQ is made earlier because the timing adjustment by the DLL circuit is not performed, which makes it possible to realize an even higher speed access.

Figure 21:
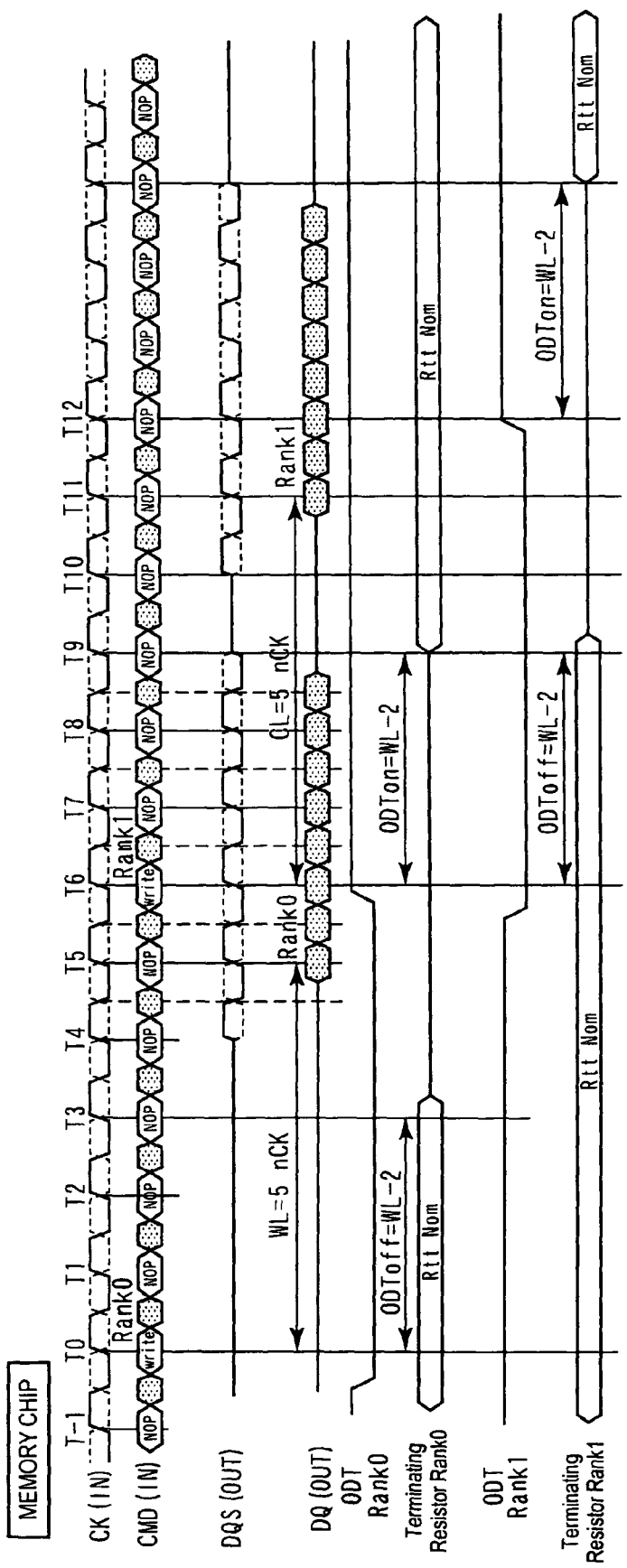
FIG. 21 is a timing chart for explaining a write-to-write operation when both the ODT function and the DLL circuit are in an ON state.

FIG. 21 is a timing chart for explaining a write-to-write operation when both the ODT function and the DLL circuit are in an ON state.

As shown in FIG. 21, a write operation timing in a state where both the ODT function and the DLL circuit are set to on is basically the same as the operation timing shown in FIG. 12. In the example shown in FIG. 21, a write command Write is issued for the Rank0 at the time T0, and another write command Write is issued for the Rank1 at the time T6. As described above, because the memory chip 200 of the Rank0 and the memory chip 200 of the Rank1 are commonly connected to the data line L1, they cause an influence on each other.

Accordingly, in a period from the time T5 to the time T9 during which write data DQ is burst input to the memory chip 200 of the Rank0, an impedance of the data input/output terminal 204 of the memory chip 200 of the Rank1 is set to Rtt_Nom by the ODT function. Similarly, in a period from the time T11 to the time T15 during which write data DQ is burst input to the memory chip 200 of the Rank1, an impedance of the data input/output terminal 204 of the memory chip 200 of the Rank0 is set to Rtt_Nom by the ODT function.

In this manner, during the memory chip 200 on one side receives the write data DQ, the memory chip 200 on the other side performs the ODT operation, which prevents a reflection of a signal. However, as described above, current consumption is generated due to the usage of the ODT function and the DLL circuit.

Figure 22:
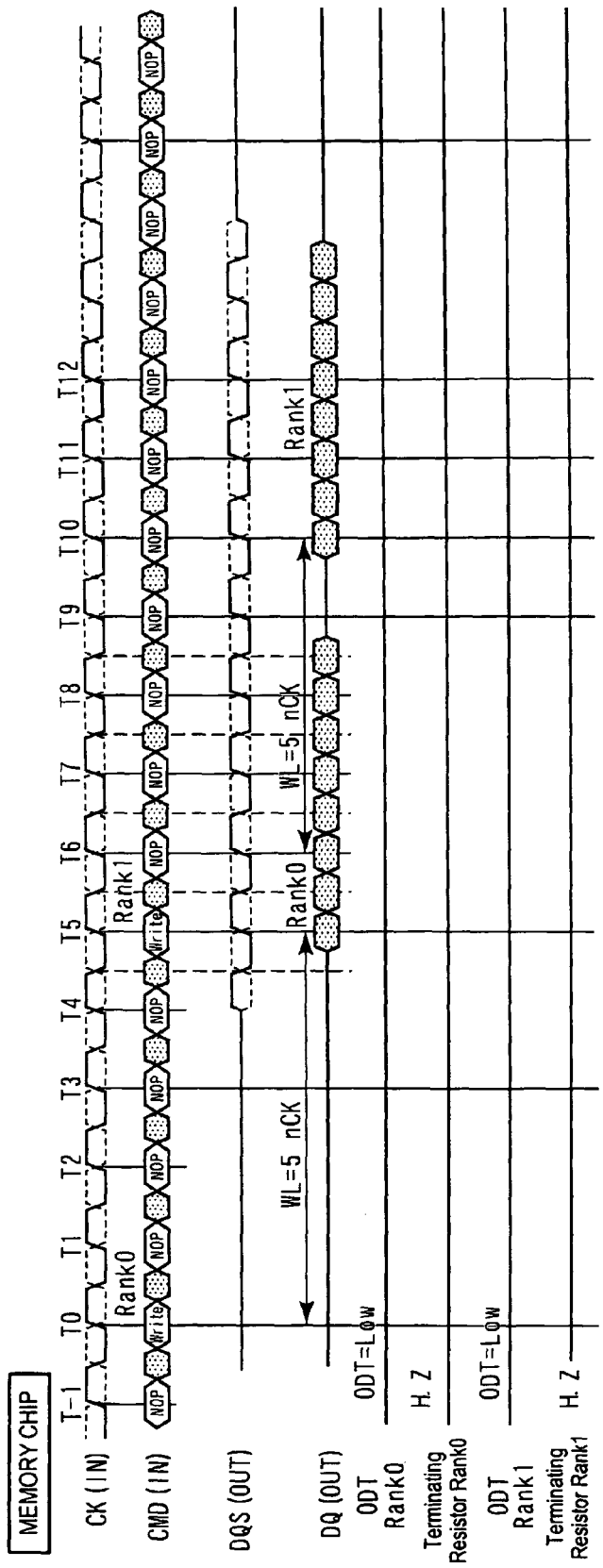
FIG. 22 is a timing chart for explaining the write-to-write operation when both the ODT function and the DLL circuit are in an OFF state.

FIG. 22 is a timing chart for explaining the write-to-write operation when both the ODT function and the DLL circuit are in an OFF state.

As shown in FIG. 22, when the ODT function is set to off, the data input/output terminal 204 of the memory chip 200 on the non-operating side becomes in a high impedance state, from which a reflection of a signal occurs. However, in the present embodiment, because the distance between the memory chip 200 and the data register buffer 300 is considerably short and the memory chip of the Rank0 and the memory chip of the Rank1 are arranged at substantially the end of the data line L1, the influence of the reflection of the signal from the memory chip 200 on the non-operating side is considerably small. Therefore, it is possible for each of the memory chips 200 to receive the write data DQ in a correct manner.

In this manner, in the present embodiment, even when both the ODT function and the DLL circuit of the memory chip 200 are set to off, that is, the current consumption due to the ODT function and the DLL circuit is made zero, it is possible to perform the same write operation as in a case that the ODT function and the DLL circuit are set to on. Rather, because an operation for switching the ODT impedance is not necessary, it is also possible to make an input timing of the write data DQ earlier. Actually, the speed of the write-to-write operation is increased by one clock cycle in the operation timing shown in FIG. 22 than in the operation timing shown in FIG. 21.

Some modifications of the present invention are explained nest.

Figure 23B:
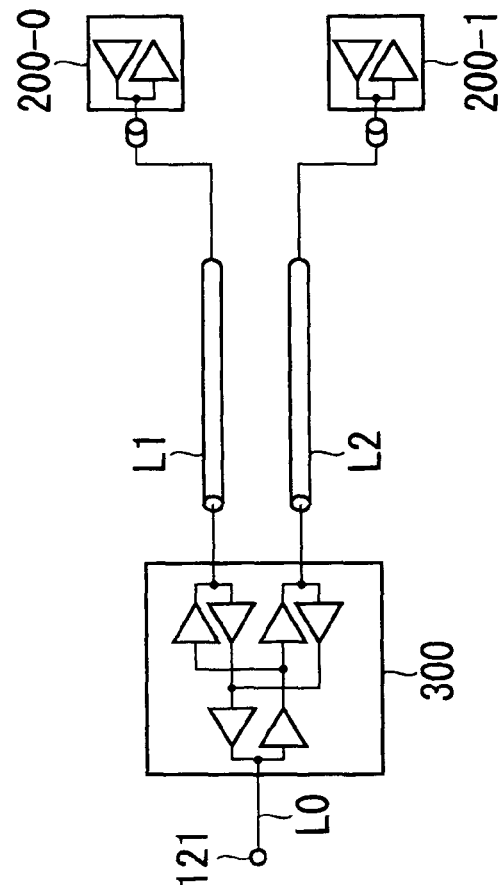
FIGS. 23A and 23B are schematic diagrams for explaining a data transfer path for transferring 1-bit data in a memory module according to a modification of the present embodiment, where
Figure 23A:
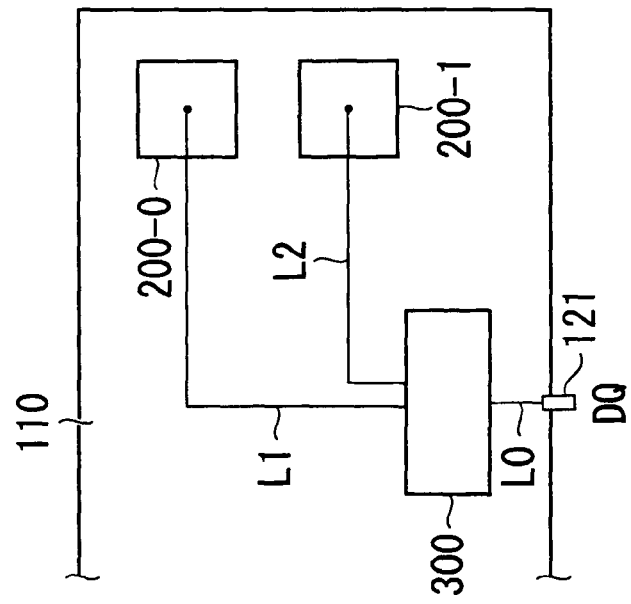

FIGS. 23A and 23B are schematic diagrams for explaining a data transfer path for transferring 1-bit data in a memory module according to a modification of the present embodiment, where FIG. 23A is a layout diagram and FIG. 23B is a connection diagram.

In the example shown in FIGS. 23A and 23B, unlike the embodiment described above, only a single memory chip 200 is connected to each of the data lines L1 and L2. Specifically, only the memory chip 200-0 is connected to the data line L1, and only the memory chip 200-1 is connected to the data line L2. The present invention also includes this type of mode. That is, the number of memory chips 200 allocated to a single data line (L1 or L2) that connects the memory chip 200 and the data register buffer 300 is not limited to a particular number. However, in order to reduce the load capacities of the data lines L1 and L2, the branch points, and the line lengths, it is preferable that the number of the memory chips 200 connected to a single data line should be equal to or less smaller than two.

Figure 24B:
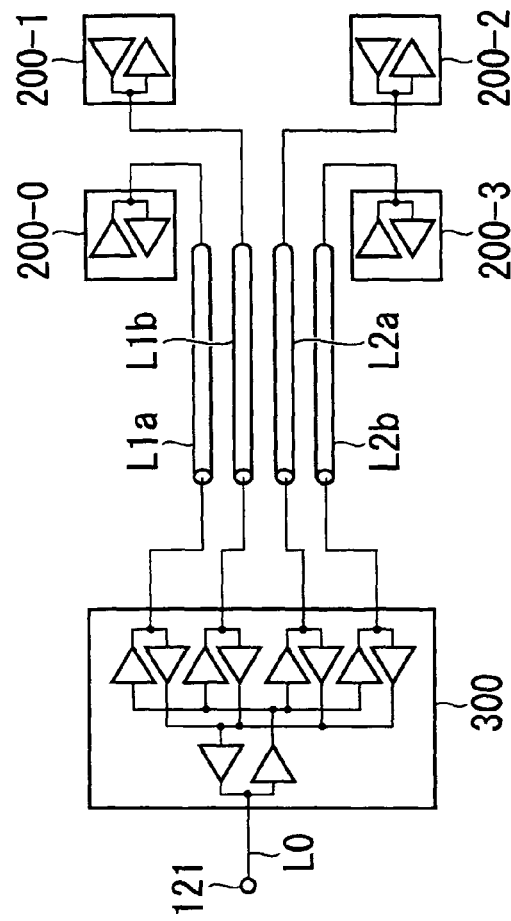
FIGS. 24A and 24B are schematic diagrams for explaining a data transfer path for transferring 1-bit data in a memory module according to another modification of the present embodiment, where
Figure 24A:
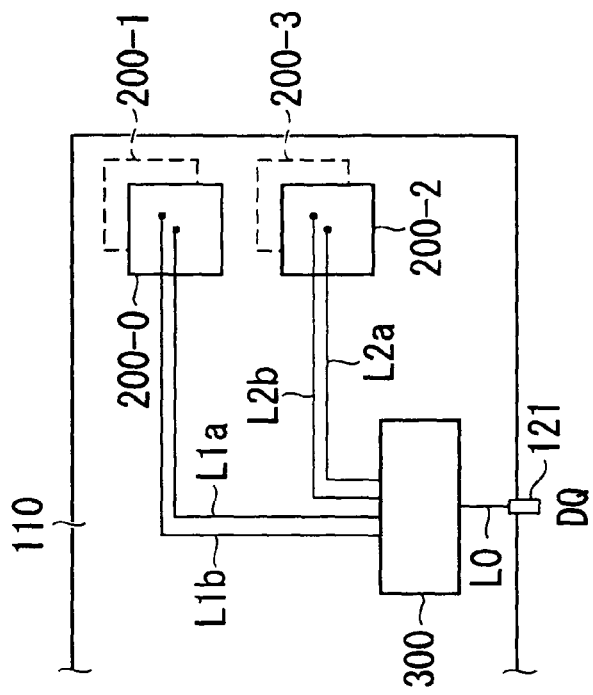

FIGS. 24A and 24B are schematic diagrams for explaining a data transfer path for transferring 1-bit data in a memory module according to another modification of the present embodiment, where FIG. 24A is a layout diagram and FIG. 24B is a connection diagram.

In the example shown in FIGS. 24A and 24B, unlike the embodiment described above, four data lines L1a, L1b, L2a, and L2b are allocated to a single data line L0. Specifically, only the memory chip 200-0 is connected to the data line L1a, only the memory chip 200-1 is connected to the data line L1b, only the memory chip 200-2 is connected to the data line L2a, and only the memory chip 200-3 is connected to the data line L2b. The present invention also includes this type of mode. That is, the number of the memory chips 200 allocated to a single data register buffer 300 is not limited to a particular number as long as it is equal to or larger than two.

Figure 25:
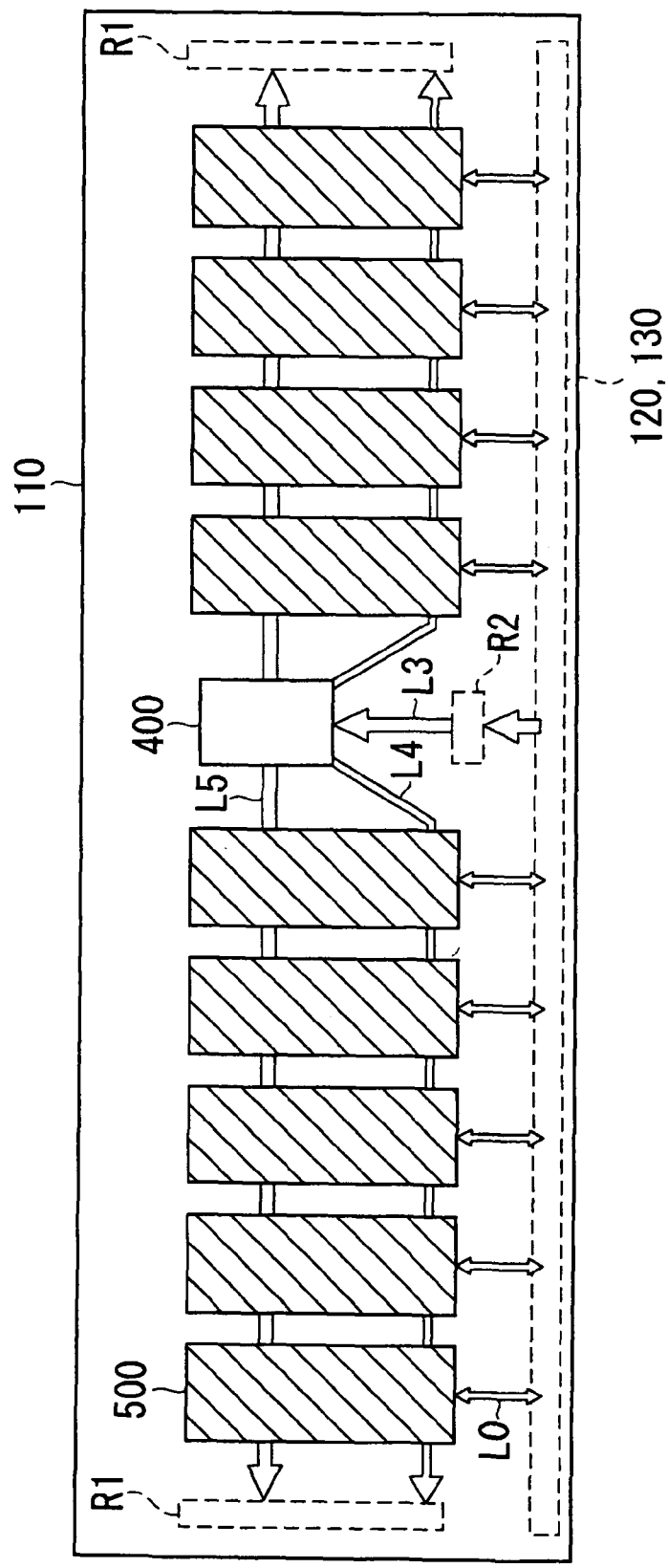
FIG. 25 is a schematic diagram of a configuration of a memory module according to still another modification of the present embodiment.

FIG. 25 is a schematic diagram of a configuration of a memory module according to still another modification of the present embodiment.

The memory module shown in FIG. 25 has such a configuration that a plurality of memory chips 200 forming the same group and a single data register buffer 300 are integrated in a sub-module 500. By using the sub-module 500, the data lines L1 and L2 can be formed on a substrate of the sub-module, so that a line density of the module PCB 110 can be relieved. In addition, because the number of parts to be mounted on the module PCB 110 is reduced by a considerable amount, the mounting process on the module PCB 110 can be simplified.

Figure 26:
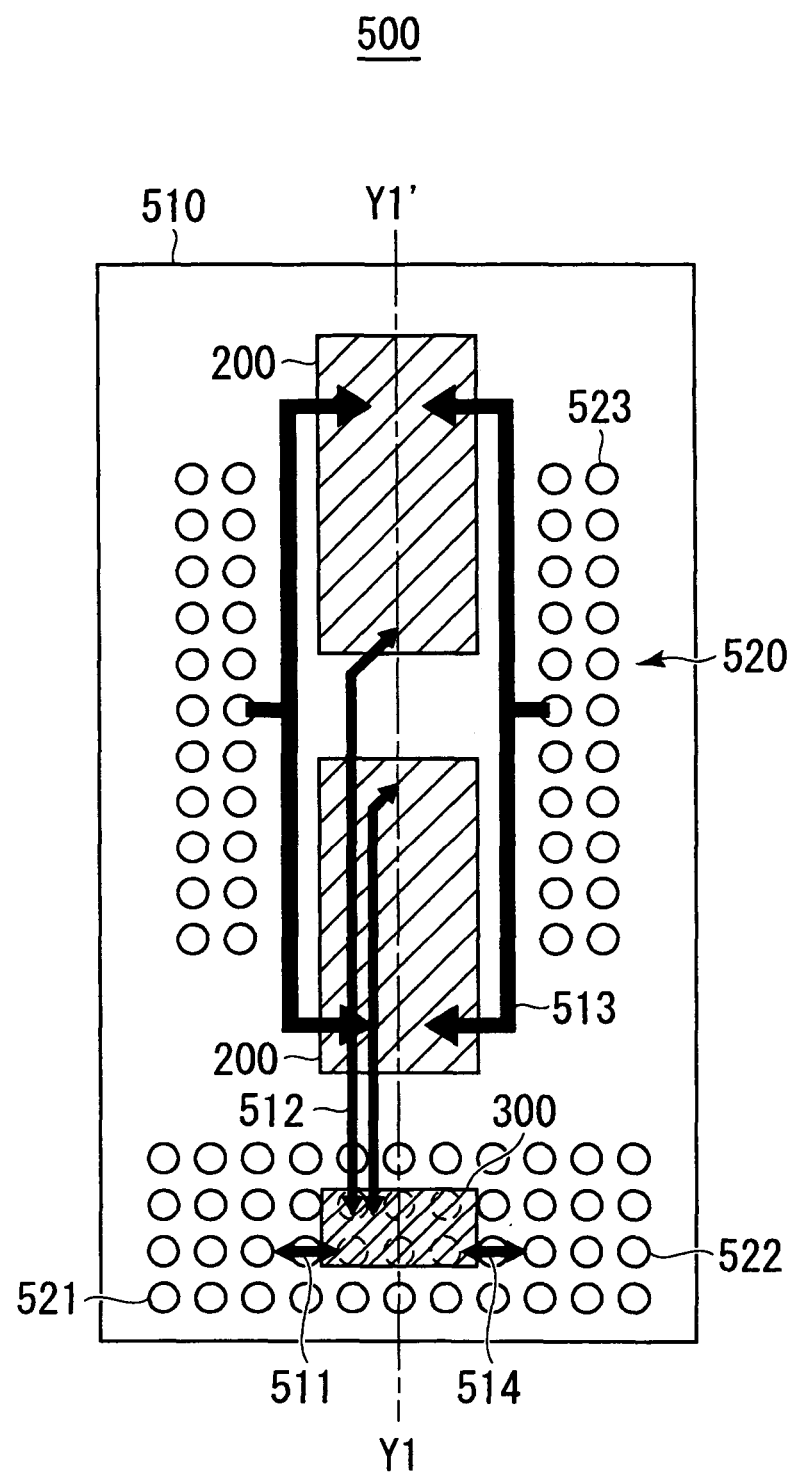
FIG. 26 is a plan view showing a configuration of the sub-module 500.
Figure 27:
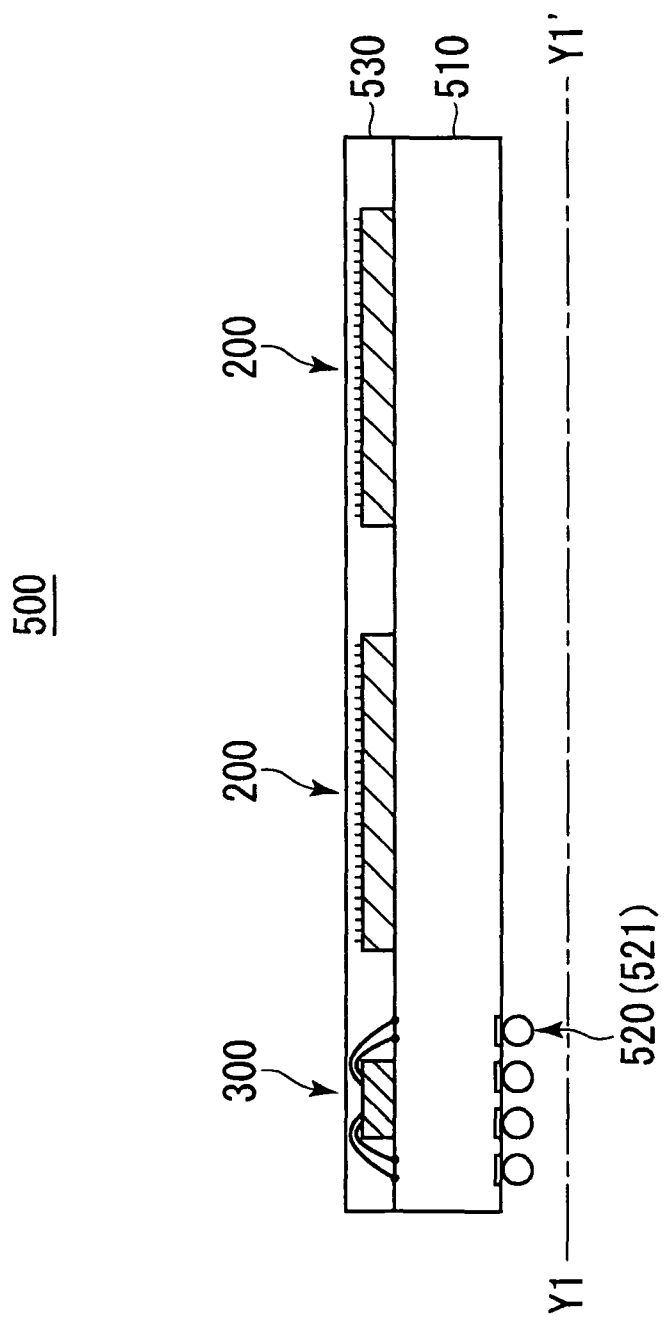
FIG. 27 is a cross section of the sub-module 500 cut along a line Y1-Y1' shown in FIG. 26.

FIG. 26 is a plan view showing a configuration of the sub-module 500; and FIG. 27 is a cross section of the sub-module 500 cut along a line Y1-Y1' shown in FIG. 26. In FIG. 26, external terminals formed on the other side are shown transparently.

The sub-module 500 shown in FIGS. 26 and 27 is configured with a sub-module PCB 510, two memory chips 200 and a data register buffer 300 mounted on the sub-module PCB 510, and external terminals (solder balls) 520 formed on the other side of the sub-module PCB 510. The memory chips 200 and the data register buffer 300 are sealed with a sealant 530.

The external terminals 520 include DQ balls 521 for performing an exchange of data, Control balls 522 for performing a reception of a control signal to be supplied to the data register buffer 300, and CA balls 523 for performing a reception of a command/address/control signal. The DQ balls 521 and the Control balls 522 are arranged on the other side of the sub-module PCB 510 near an area in which the data register buffer 300 is mounted. On the other hand, the CA balls 523 are arranged on the other side of the sub-module PCB 510 near an area in which the memory chips 200 are mounted.

The DQ balls 521 and the Control balls 522 are connected to the data register buffer 300 via internal lines 511 and 514 that are formed on the sub-module PCB 510. The CA balls 523 are connected to the memory chips 200 via internal lines 513 that are formed on the sub-module PCB 510.

Using the sub-module 500 configured in the above manner eliminates a necessity of forming the data lines L1 and L2 for connecting the memory chips 200 and the data register buffer 300 on the module PCB 110. As a result, a freedom in the layout of the module PCB 110 is enhanced.

Figure 28:
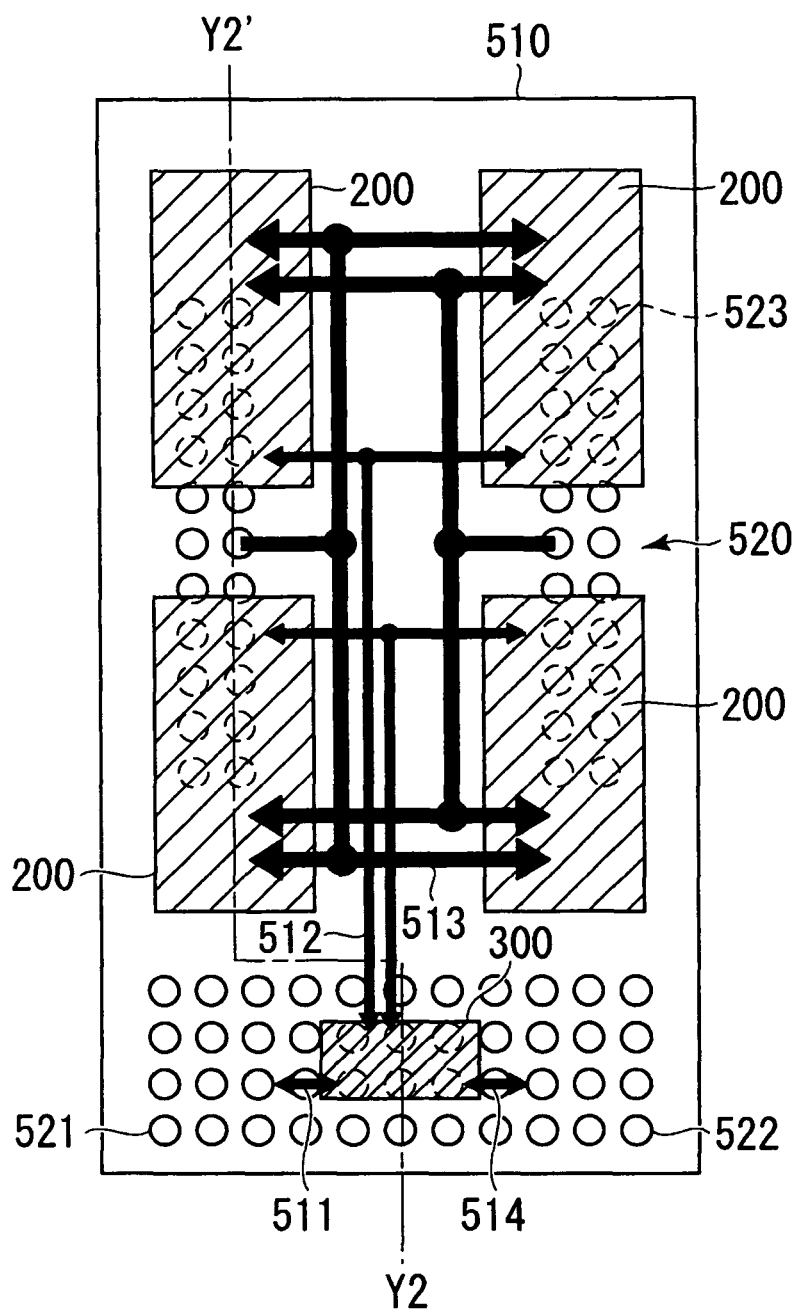
FIG. 28 is a plan view showing another configuration of the sub-module 500.
Figure 29:
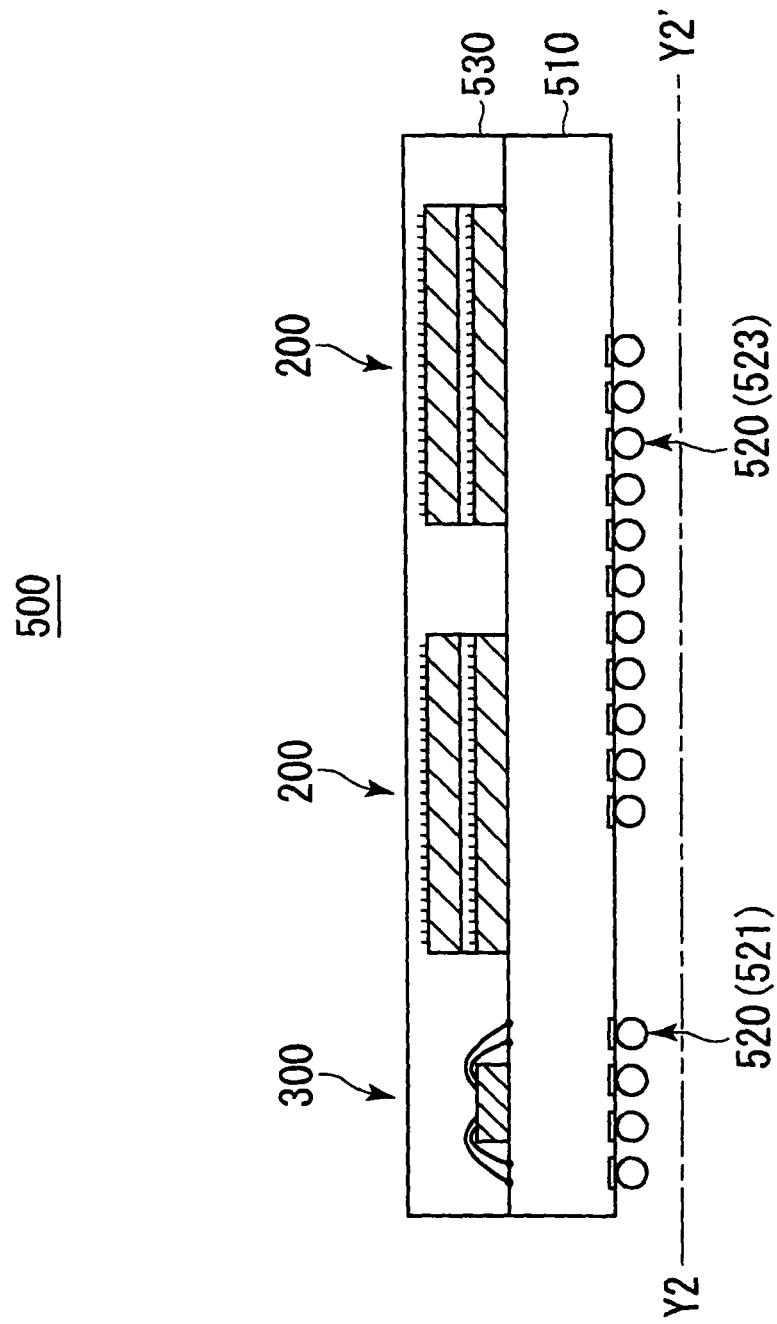
FIG. 29 is a cross section of the sub-module 500 cut along a line Y2-Y2' shown in FIG. 28.

FIG. 28 is a plan view showing another configuration of the sub-module 500; and FIG. 29 is a cross section of the sub-module 500 cut along a line Y2-Y2' shown in FIG. 28. In FIG. 28, external terminals formed on the other side are shown transparently.

The sub-module 500 shown in FIGS. 28 and 29 has basically the same configuration as that of the sub-module 500 shown in FIGS. 26 and 27, with a difference in that eight memory chips 200 are mounted on the sub-module PCB 510. The eight memory chips 200 are formed with four layered bodies in each of which two memory chips 200 are layered. The four layered bodies are two-dimensionally mounted on the sub-module PCB 510. Using the sub-module 500 configured in the above manner makes it possible to increase a memory capacity of the memory module.

It is apparent that the present invention is not limited to the above embodiments, but may be modified and changed without departing from the scope and spirit of the invention. For example, while the above embodiment has described a memory chip that includes a DLL circuit therein as the memory chip 200, a memory chip that does not include a DLL circuit therein can be alternatively used. In this case, the DLL circuit included in the data register buffer 300 is used to adjust the input/output timing.

What is claimed is:

1. A memory module comprising:
    a module substrate;
    a plurality of sets of data connectors provided on the module substrate;
    a plurality of sets of memory chips mounted over the module substrate, each of the sets of memory chips including at least two memory chips;
    a plurality of data register buffers mounted over the module substrate, each of the data register buffers being coupled to an associated one of the sets of data connectors and to an associated one of the sets of memory chips so that the each of the data register buffers receives write data from the associated one of sets of data connectors, outputs the write data to one of the at least two memory chips of the associated one of the sets of memory chips, receives read data from one of the at least two memory chips of the associated one of the sets of memory chips, and outputs the read data to the associated one of the sets of data connectors;
    a set of command/address/control connectors provided on the module substrate; and
    a command/address/control register buffer mounted over the module substrate independently of each of the data register buffers and including a register circuit unit that receives a plurality of first control signals from the command/address/control connectors and transfers the first control signals in common to the sets of memory chips and a control signal generating circuit that receives the first control signals from the command/address/control connectors to generate a second control signal and supplies the second control signal in common to the data register buffers,
    wherein the command/address/control register buffer further comprises a first clock generation circuit generating a first clock signal and supplying the first clock signal in common to the data register buffers, each of the data register buffers includes a second clock generation circuit receiving the first clock signal and generating a second clock signal, and each of the data register buffers outputs the write data in response to the second clock signal.

2. The memory module as claimed in claim 1, wherein each of the data register buffers includes a serial parallel converter unit converting the write data from serial to parallel.

3. The memory module as claimed in claim 1, wherein each of the data register buffers includes a parallel serial converter unit converting the read data from parallel to serial.

4. The memory module as claimed in claim 1, wherein the second clock signal is substantially equal in phase to the first clock signal.

5. The memory module as claimed in claim 1, wherein each of the data register buffers outputs the read data in response to the second clock signal.

6. The memory module as claimed in claim 1, wherein each of the data register buffers includes a control unit adjusting a first timing of outputting of the read data and a second timing of outputting of the write data in response to the second control signal, and the control unit supplies the control signal generating circuit of the command/address/control register buffer with a feedback signal that represents a status of the control unit.

7. The memory module as claimed in claim 1, wherein the first clock generation circuit of the command/address/control register buffer includes a PLL circuit.

8. The memory module as claimed in claim 1, wherein the second clock generation circuit of each of the data register buffers includes a DLL circuit.

9. The memory module as claimed in claim 1, wherein the first clock generation circuit of the command/address/control register buffer includes a PLL circuit and the second clock generation circuit of each of the data register buffers includes a DLL circuit.

10. The memory module as claimed in claim 1, wherein the first clock generation circuit of the command/address/control register buffer further generates a third clock signal and supplies the third clock signal in common to the sets of memory chips and each of the memory chips of each of the sets of memory chips operates in response to the third clock signal.

11. The memory module as claimed in claim 10, wherein the first clock signal and the third clock signal are substantially equal in phase to each other.

12. The memory module as claimed in claim 10, wherein each of the memory chips of each of the sets of memory chips includes a third clock generation circuit receiving the third clock signal and generating a fourth clock signal and each of the memory chips of each of the sets of memory chips outputs the read data in response to the fourth clock signal.

13. The memory module as claimed in claim 12, wherein the third clock generation circuit of each of the memory chips of each of the sets of memory chips includes a DLL circuit.

14. A memory module comprising:
a module substrate;
a plurality of sets of data connectors provided on the module substrate;
a plurality of sets of memory chips mounted over the module substrate, each of the sets of memory chips including at least two memory chips;
a plurality of data register buffers mounted over the module substrate, each of the data register buffers being coupled to an associated one of the sets of data connectors and to an associated one of the sets of memory chips so that the each of the data register buffers receives write data from the associated one of sets of data connectors, output the write data to the associated one of sets of memory chips, receives read data from the associated one of sets of memory chips, and output the read data to the associated one of sets of data connectors;
a set of command/address/control connectors provided on the module substrate; and
a command/address/control register buffer mounted over the module substrate independently of each of the data register buffers and including a register circuit unit that receives a plurality of first control signals from the command/address/control connectors and transfers the first control signals in common to the sets of the memory chips and a control signal generating circuit that receives the first control signals from the command/address/control connectors to generate a second control signal and supplies the second control signal in common to the data register buffers,
wherein the command/address/control register buffer further comprises a first clock generation circuit generating a first clock signal and supplying the first clock signal in common to the data register buffers, each of the data register buffers includes a second clock generation circuit receiving the first clock signal and generating a second clock signal, and each of the data register buffers outputs the read data in response to the second clock signal.

15. The memory module as claimed in claim 14, wherein the first clock generation circuit of the command/address/control register buffer includes a PLL circuit.

16. The memory module as claimed in claim 14, wherein the second clock generation circuit of each of the data register buffers includes a DLL circuit.

17. The memory module as claimed in claim 14, wherein the first clock generation circuit of the command/address/control register buffer includes a PLL circuit and the second clock generation circuit of each of the data register buffers includes a DLL circuit.

18. The memory module as claimed in claim 14, wherein the first clock generation circuit of the command/address/control register buffer further generates a third clock signal and supplies the third clock signal in common to the sets of memory chips and each of the memory chips of each of the sets of memory chips operates in response to the third clock signal.

19. The memory module as claimed in claim 18, wherein the first clock signal and the third clock signal are substantially equal in phase to each other.

20. The memory module as claimed in claim 18, wherein each of the memory chips of each of the sets of memory chips includes a third clock generation circuit receiving the third clock signal and generating a fourth clock signal and each of the memory chips of each of the sets of memory chips outputs the read data in response to the fourth clock signal.

21. The memory module as claimed in claim 20, wherein the third clock generation circuit of each of the memory chips of each of the sets of memory chips includes a DLL circuit.

* * * * *